(12) United States Patent
Cornwall et al.

(10) Patent No.: US 11,454,672 B2
(45) Date of Patent: Sep. 27, 2022

(54) BATTERY LIFE EXTENSION VIA CHANGES IN TRANSMISSION RATES

(71) Applicant: Itron, Inc., Liberty Lake, WA (US)

(72) Inventors: Mark K. Cornwall, Spokane, WA (US); James Lee Kann, Mica, WA (US)

(73) Assignee: Itron, Inc., Liberty Lake, WA (US)

( * ) Notice: Subject to any disclaimer, the term of this patent is extended or adjusted under 35 U.S.C. 154(b) by 950 days.

(21) Appl. No.: 16/231,145

(22) Filed: Dec. 21, 2018

(65) Prior Publication Data

US 2020/0200827 A1 Jun. 25, 2020

(51) Int. Cl.
| | |
|---|---|
| G01R 31/36 | (2020.01) |
| G01R 31/382 | (2019.01) |
| G06F 9/30 | (2018.01) |
| H01M 10/42 | (2006.01) |
| G06F 1/3212 | (2019.01) |

(52) U.S. Cl.
CPC ....... G01R 31/3646 (2019.01); G01R 31/382 (2019.01); G06F 1/3212 (2013.01); G06F 9/30003 (2013.01); H01M 10/425 (2013.01); *H01M 2010/4271* (2013.01)

(58) Field of Classification Search
None
See application file for complete search history.

(56) References Cited

U.S. PATENT DOCUMENTS

| | | |
|---|---|---|
| 7,298,288 B2 | 11/2007 | Nagy et al. |
| 8,031,082 B2 | 10/2011 | Cornwall |
| 8,242,887 B2 | 8/2012 | Cornwall et al. |
| 2008/0068213 A1 | 3/2008 | Cornwall et al. |
| 2010/0265096 A1 | 10/2010 | Cornwall et al. |
| 2011/0316964 A1 | 12/2011 | Nakanishi |
| 2012/0151028 A1* | 6/2012 | Lu ............... H04L 67/2861 709/223 |

(Continued)

FOREIGN PATENT DOCUMENTS

WO WO2007030826 3/2007

OTHER PUBLICATIONS

The PCT Search Report and Written Opinion dated May 4, 2020 for PCT Application No. PCT/US2019/066383, 17 pages.

(Continued)

*Primary Examiner* — Roy Y Yi
(74) *Attorney, Agent, or Firm* — Lee & Hayes, P.C.

(57) ABSTRACT

Disclosed are techniques to conserve battery of an endpoint device. Example techniques include adjusting the size of messages transmitted by an endpoint device and/or adjusting the transmission rate of an endpoint device. In some configurations, the one or more criteria are used by an endpoint device to determine what data fields to include within a message and/or adjust a transmission rate associated with the transmission of messages by the endpoint device. For instance, the one or more criteria may include the battery level of the device, the time of year, whether the data has already been transmitted by the endpoint device, whether the data has been acknowledged as received by another device, whether the endpoint device has been instructed by another device to reduce the message size and/or adjust the transmission rate, and the like.

20 Claims, 13 Drawing Sheets

(56) References Cited

U.S. PATENT DOCUMENTS

2013/0128809 A1    5/2013  Wentink et al.
2014/0084686 A1*   3/2014  Nishibayashi .......... H02J 3/322
                                                         307/26

OTHER PUBLICATIONS

Office Action for U.S. Appl. No. 16/231,101, dated Dec. 3, 2020, Kann, "Battery Life Extension via Changes in Message Size", 10 Pages.
The Invitation to Pay Additional Fees Received dated Mar. 10, 2020, for PCT Application No. PCT/US2019/066383, 13 pages.
The PCT Search Report and Written Opinion dated Feb. 28, 2020 for PCT Application No. PCT/US2019/066369, 10 pages.

* cited by examiner

| Field # | Field Name | Length(bits) | Value |
|---|---|---|---|
| 1 | Preamble | 32 | 0x5555904E |
| 2 | Protocol ID | 8 | (See 460) |
| 3 | Endpoint Type and Subtype | 8 | * |
| 4 | Endpoint Serial Number | 32 | * |
| 5 | Current Consumption | 32 | * |
| 6 | Tampers/Flags | 16 | * |
| 7 | CRC-16 | 16 | * |

Message A (18 Bytes) – Fields 1-7          Protocol ID Value (0x06)
Message B (16 Bytes) – Fields 1-5, and 7   Protocol ID Value (0x07)
Message C (12 Bytes) – Fields 1-4, and 7   Protocol ID Value (0x08)
Message D (11 Bytes) – Fields 1, 2, 4, and 7   Protocol ID Value (0x09)
Message E (14 Bytes) – Fields 1-4, and 6, 7   Protocol ID Value (0x0A)

FIG. 4B

BATTERY LIFE EXTENSION VIA CHANGES IN TRANSMISSION RATES

BACKGROUND

Utility meters such as electric, water and gas meters have evolved from isolated devices that simply measure utility consumption and display a consumption reading to "smart meters" that are connected devices capable of reporting resource consumption readings automatically over a utility communication network. Some meters, such as electric meters, are powered by alternating current electricity service from the electricity grid. Other devices, such as many water and gas meters, are battery powered. In many cases, such battery powered devices are expected to operate for extended periods of time (twenty years or more) without being recharged or having a battery replaced.

The capabilities of smart meters are continuously growing. Many of the added capabilities of smart meters come with increased energy demands. However, battery technologies have not kept pace with the increased energy demands. In some cases, battery powered smart meters have not been able to adopt some of these new capabilities.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIG. 4B is a diagram illustrating an example message that includes different data fields transmitted by an endpoint device.

DETAILED DESCRIPTION

Overview

Figure 1:
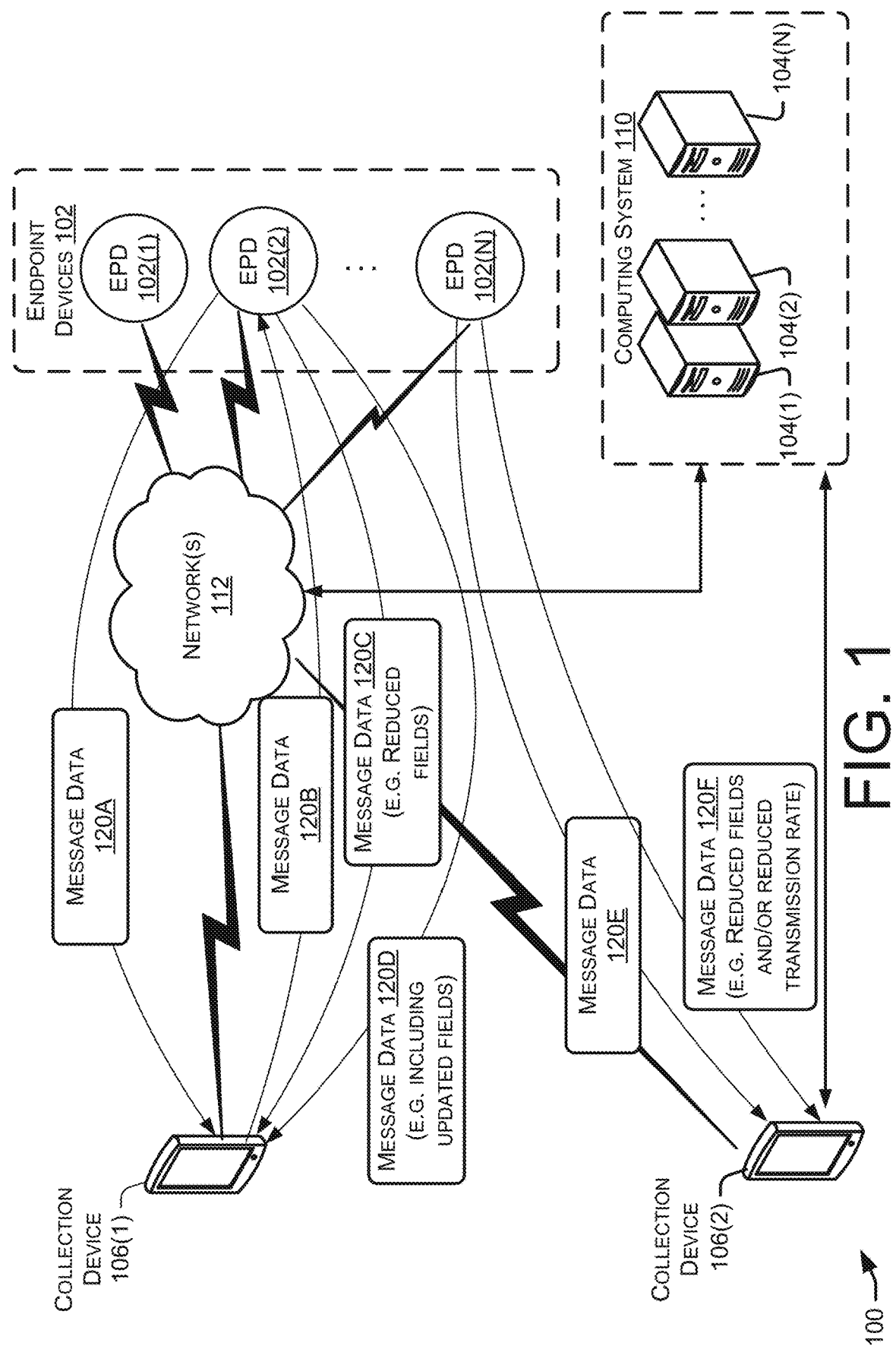
FIG. 1 is a schematic diagram of an example network architecture, including endpoint devices, such as battery powered devices, that change the size of messages transmitted and/or adjust the transmission rate to conserve battery.

As discussed above, battery powered smart meters and other battery powered devices (which may be referred to herein as "endpoint devices") provide functionality and connectivity at the cost of sacrificing battery life. This disclosure describes techniques to extend the battery life of endpoint devices by adjusting message size and/or transmission rates for messages transmitted by the endpoint devices. For instance, in some examples, the disclosure describes techniques for removing or omitting one or more data fields from a message to reduce the energy expended by the endpoint device to transmit the message. In other examples, the transmission rate at which messages are sent by the endpoint device can be adjusted to reduce the battery consumption of a device. In some configurations, an endpoint device, such as a utility smart meter, transmits messages which may be referred to herein as "bubble-up messages". According to some examples, these messages can be periodically transmitted by the endpoint device (e.g., a utility smart meter) and/or transmitted in response to receiving a "wake up" polling signal containing a request for information associated with the endpoint device (e.g., meter information such as consumption information, tamper information, . . . ). Generally, these "bubble-up" messages are sent without receiving a request for information. Instead, these "bubble-up" messages are unsolicited information that include information about the endpoint device. As described herein, the messages, such as "bubble-up" messages, can include a different data fields at different times. In some cases, the "bubble-up" messages transmitted by the smart utility meter, or some other endpoint, include a device identifier that identifies the endpoint device and a protocol identifier that identifies the data fields included in the "bubble-up" message. More details are provided below.

According to some configurations, one or more criteria are used by the endpoint device to determine what data fields to include within a message and/or when to adjust a transmission rate associated with the transmission of messages by the endpoint device. For instance, the one or more criteria may include the battery level of the endpoint device, an age or time since activation or installation of the endpoint device, the time of year (e.g., winter, summer, . . . ), the time within a billing cycle (e.g., a day within the billing cycle, a week of the billing cycle, etc.), whether the data has already been transmitted by the endpoint device, a number of times the data has already been transmitted by the device, whether the data has been acknowledged as received by another device, whether the endpoint device has been instructed by another device to reduce the message size and/or adjust the transmission rate, whether the endpoint device is being utilized (e.g., whether it has measured consumption of a resource within a threshold period of time), a number of lifetime transmissions of the endpoint device, and the like. In some configurations, the fields included within a message include at least a device identifier field that includes a device identifier that identifies the device and a protocol identifier field that includes a protocol value that identifies the data fields included in a message.

Generally, the "battery level" may refer to remaining battery life of the device, such as indicated by the current state of a charge of a battery. The state of charge of a battery may be indicated in different ways, such as but not limited to along a scale (e.g., 0-100%), within a classification (e.g., full, half, low), and the like. In other examples, the battery level may be based on a time the endpoint device has been in service. For instance, the battery level may be considered at a first level for a first period of time (e.g., the first several years from the time the endpoint device was placed in service), at a second level for a second period of time, and the like. The battery level may be measured using different techniques. For example, the voltage of the battery can be measured, a coulomb counter may be used, impedance tracking can be utilized, as well as other battery measurement techniques may be utilized. According to some configurations, the battery level of the endpoint device can be estimated based on the operations performed by the endpoint device. For instance, the energy use (e.g., micro-amp-seconds) associated with the endpoint device performing different operations can be determined. The energy use for performing the different operations may be determined during development of the operations and/or development of the endpoint devices or determined at some other time. When the endpoint device is in service, a counter, or some other mechanism, can be utilized to estimate how many micro-amp-seconds have been used for the operations performed by the endpoint device.

As an example, when the battery level of an endpoint device is above a first threshold (e.g., >10%, 20%, 50%, . . . ), or within a range of battery levels (e.g., between 50%-90%, . . . ) the endpoint device, such a smart utility meter, transmits messages without reducing the size of the message (e.g., each of the data fields of the message is transmitted) and/or without adjusting the transmission rate. When the battery level of the endpoint device drops below the first threshold, however, the size of the message may be reduced (e.g., one or more fields of the message can be removed prior to transmission) and/or the transmission rate may be reduced. For instance, instead of transmitting at a first rate (e.g., 15 second intervals), the transmission rate may be changed to a second, slower rate (e.g., 20 second intervals). In some examples, the transmission rate may be further reduced to a third, still slower rate (e.g., 30, 40, 50 second intervals) upon the battery level falling below a second threshold (e.g., <50%, 20%, 10%, etc.).

Many different thresholds can be utilized. In some configurations, an authorized user may configure the thresholds. For example, a customer utilizing the endpoint device, may be authorized to configure the thresholds. While two thresholds are described in the above example, fewer or more thresholds can be utilized. Further, instead of using thresholds, a formula, a machine learning mechanism, or some other technique can be used to determine when to adjust the message size and/or change the transmission rate. Generally, the fewer bytes transmitted in a message by the endpoint device and the less frequently the messages are transmitted conserves battery of an endpoint device.

According to some techniques described herein, the size of the message transmitted is reduced by the endpoint device in response to determining that another electronic device has received the same data in a previous transmission of the message. In some examples, the endpoint device determines that the transmitted data has been received based on receipt of a message acknowledging receipt of the message from a collection device.

After receiving a message, or some other data, indicating that the message has been received, the endpoint device generates messages for transmission that removes or omits one or more of the data fields. In some examples, the endpoint device transmits an identifier data field that identifies the endpoint device and omits the other data fields of the message. In other examples, the endpoint device may generate messages that include more data fields.

According to some configurations, when a value of a data field not currently included within a message transmitted by the endpoint device changes, the endpoint device includes that data field when generating a message for transmission. For example, when the endpoint device is a smart utility meter and a consumption value of the utility meter changes, the endpoint device generates a message that also includes a consumption data field. In this way, the endpoint device transmits updated data without having to transmit data that has already been received by a collection device.

Transmitting smaller messages has many benefits. For example, noise in the RF spectrum used for transmitting messages is reduced, which also decreases potential interference with collection devices that may be collecting other data from other electronic devices. The battery consumption of the endpoint device is also reduced by transmitting smaller messages thereby extending the life of the electronic device. Network traffic is also reduced since fewer messages may be transmitted and/or messages smaller in size may be transmitted.

Many of the examples described in the disclosure are given in the context of an advanced metering infrastructure (AMI) of a utility communication network. However, the techniques described herein are not limited to use in a utility industry AMI. Rather, unless specifically described to the contrary, the techniques described herein applicable to any other communications network, control network, and/or other type of network or system that includes battery powered network communication devices. By way of example and not limitation, network communication devices include utility meters (e.g., electricity, water, or gas meters), relays, repeaters, routers, transformers, sensors, switches, encoder/receiver/transmitters (ERTs), appliances, personal computers (e.g., desktop computers, laptop computers, etc.), mobile devices (smartphones, tablets, etc.), servers, access points, or the like. Battery powered network communication devices (or "battery powered devices") are network communication devices that rely on a battery for power (i.e., are not connected to mains power).

Example Environment

FIG. 1 is a schematic diagram of an example network architecture 100, including endpoint devices 102, such as battery powered devices, that change the size of messages transmitted and/or adjust the transmission rate to conserve battery life and/or reduce network traffic. The architecture 100 includes multiple network communication devices. As illustrated, the network communication devices include endpoint devices ("EPD") 102(1), 102(2), . . . 102(N) (collectively referred to as "endpoint devices 102"), collection devices 106(1), 106(2) (collectively referred to as "collection devices 106"), and computing devices 104(1), 104(2), . . . 104(N) (collectively referred to as "computing devices 104").

The endpoint devices 102 include N battery powered devices, where N is any integer greater than or equal to 1. In the illustrated example, the endpoint devices 102 are representative smart sensors associated with utility meters such as, but not limited to water meters and/or gas meters. However, as noted above, in other examples, endpoint devices 102 may comprise other types of electronic devices, respectively.

The endpoint devices 102, collection devices 106, and/or computing devices 104 may be in wireless communication with one another. For example, the endpoint devices 102 may be configured to communicate with one or more collection devices 106 via radio frequency (RF) channels and/or one or more networks, such as network 112. Examples of networks include, for example, local area networks (LANs), neighborhood area networks (NANs), personal area networks (PANs), home area networks (HANs), or the like. While only one network 112 is shown in FIG. 1, in practice, multiple networks may exist and may collectively define a larger network, such as an advanced metering infrastructure (AMI) of a utility communication network.

The endpoint devices 102 may also use one or more links to communicate with other electronic devices, such as collection devices 106, computing devices 104, and/or other electronic devices (not shown). The term "link" refers to a direct communication path between two devices (without passing through or being relayed by another device). A link may be over a wired or wireless communication path. Each link may represent a plurality of channels over which a device is able to transmit or receive data. Each of the plurality of channels may be defined by a frequency range which is the same or different for each of the plurality of channels. In some instances, the plurality of channels comprises RF channels. The plurality of channels may comprise a control channel and multiple data channels. In some instances, the control channel is utilized for communicating one or more messages between devices to specify one of the data channels to be utilized to transfer data. Generally, transmissions on the control channel are shorter relative to transmissions on the data channels. An area network may implement a channel hopping sequence, such that the control channel and data channels change over time.

In some examples, a network may be a mesh network, in which the network communication devices relay data through the mesh network. Other types of networks (e.g., star or hub-and-spoke networks, mobile networks, cellular networks, etc.) can also be utilized. Additionally, in some instances, one or more devices may be able to communicate with multiple different types of networks (e.g., a mesh network and a star network) at the same or different times.

The computing system 110 includes computing devices 104(1), 104(2), . . . 104(N) that can be configured to provide one or more services. For example, the computing system 110 can be configured as a meter data management system (in the utility context), a customer relationship management system (in the sales context), a diagnostic system (in a manufacturing context), an inventory system (in a warehouse context), a patient record system (in the healthcare context), a billing system, etc. In some examples, the computing system 110 is associated with a utility service provider.

The computing system 110 may be physically located in a single central location or may be distributed at multiple different locations. The computing system 110 may be hosted privately by an entity administering all or part of the communications network (e.g., a utility company, a governmental body, distributor, a retailer, manufacturer, etc.), or may be hosted in a cloud environment, or a combination of privately hosted and cloud hosted services.

Generally described, the example network architecture 100 depicted in FIG. 1 includes endpoint devices 102, a computing system 110, and collection devices 106. The endpoint devices 102 are associated with, for example, utility meters UM (e.g., gas meters, water meters, electric meters, etc.), for obtaining data associated with a utility meter. For example, the endpoint devices 102 can be configured to provide data such as consumption data, tampering data, and the like associated with a UM.

As briefly discussed, the endpoint devices 102 may be a wired or wireless communications device capable of performing two-way communications with a collection system, such as wireless communication with collection devices 106. For example, the endpoint devices 102 are capable of receiving data (e.g., messages, commands, software and/or firmware updates, etc.) from collection devices 106, or some other device or component, and transmitting meter data or other information to collection devices 106. Depending on the exact configuration and types of devices used, the endpoint devices 102 transmit standard meter readings either periodically ("bubble-up") according to a transmission rate, in response to a wake-up signal, or in a combination/hybrid configuration. In some configurations, the endpoint devices 102 are configured to exchange data with collection devices 106.

In the current example, the collection devices 106 collect meter reading data and other data from the plurality of endpoint devices 102, process the data, and forward the data to the computing system 110 associated with a utility service provider. The collection devices 106 may employ any number of AMR protocols and devices to communicate with the endpoint devices 102. In the example shown, a collection device 106, for example, may be a handheld meter reader capable of radio-based collection and/or manual entry of meter readings. In other examples, the collection devices 106 may also include a mobile collection unit (e.g., utility vehicle not shown), configured with a radio transmitter/receiver for collecting meter readings within a drive-by coverage area. According to some examples, the collection devices 106 are configured to forward meter readings to the computing system 110 over a network, such as a wide area network 112, which may be implemented utilizing TCP/IP Protocols (e.g., Internet), GPRS or other cellular based protocols, Ethernet, WiFi, Broadband Over Power Line, and combinations thereof, etc. In some examples, the collection devices 106 can be configured to receive the "bubble-up messages" transmitted by endpoint devices 102, such as smart utility meters. According to some examples, the collection devices 106 receive a bubble-up message and decode the data of the message based on the protocol identifier that identifies the data fields included within the bubble-up message. As described herein, the collection device 106 can also transmit a "wake up" polling signal containing a request for information associated with the endpoint device (e.g., meter information such as consumption information, tamper information, . . . ). In some examples, if the collection device 106 wants information not contained within a transmitted bubble-up message, the collection device 106 can transmit a message to the endpoint device requesting the desired information. As briefly discussed, this disclosure describes techniques to extend the battery life of endpoint devices by adjusting message size and/or transmission rates for messages transmitted by the endpoint devices. For instance, in some examples, the disclosure describes techniques for removing or omitting one or more data fields from a message to reduce the energy expended to transmit the message. In other examples, the transmission rate at which messages are sent can be adjusted to reduce the battery consumption of an endpoint device 102.

According to some techniques described herein, the size of the message transmitted is reduced by the endpoint device 102 in response to determining that another electronic device has received the data. In the example illustrated in FIG. 1, EPD 102(2) is transmitting message data 120A to collection device 106(1). In some configurations, the EPD 102(2) transmits message data 120A that includes the data fields specified by a type of message In the example of a utility service, the EDP 102(2) may initially transmit message data 120A that includes an identifier data field that identifies the EPD 102(2), a consumption data field that identifies consumption of a utility meter associated with the EPD 102(2), a tampering data field that identifies tampering of the EPD 102(2), and the like. More details will be provided below. For example, see FIG. 4B and related description for an exemplary message and data fields associated with a utility meter.

In some examples, the EPD 102(2) determines that the transmitted message data 120A has been received in response to receiving message data 120B from collection device 106(1). According to some configurations, the endpoint devices 102 are configured to listen for transmissions during a "listen window". A "listen window" is a time the endpoint device is actively listening for messages transmitted by another device. In some examples, the message data 120B received by EPD 102(2) can be an acknowledgment message ("ACK"). In other examples, the message data 120B received by the EPD 102(2) may be a request for additional data and/or some other instruction.

After receiving message data 120B, or some other data, indicating that the message 120A has been received by the collection device 106(1), the endpoint device EPD 102(2) generates subsequent messages for transmission that remove one or more of the data fields. In some examples, the EPD 102(2) transmits message data 120C that includes an identifier data field that identifies the endpoint device and removes the other data fields of the message. In other examples, the EPD 102(2) may generate messages that include additional data fields but removes at least some of the data that was transmitted in message data 120A.

According to some configurations, when a value of data associated with a data field not included within a message, changes, an endpoint device 102, such as EPD 102(2) includes that data field and updated value when generating a subsequent message to transmit. For example, when the endpoint device 120 is a smart utility meter and a consumption value of the utility meter changes, the EPD 102(2) generates message data 120D that also includes a consumption data field and transmits the message. Some data fields of a message may not be included within a message and transmitted for long periods of time. For instance, a tamper data field may initially be transmitted by an endpoint device 102 but may not be included within messages subsequently transmitted by the endpoint device 102 since it is not typical for an endpoint device to be tampered with.

According to some configurations, one or more criteria are used by an endpoint device 102 to determine what data fields to include within a message and/or adjust a transmission rate associated with the transmission of messages by the endpoint device. For instance, the criteria may include the current battery level of the device, the time of year (e.g., winter, summer, . . . ), whether the data has already been transmitted and received by another device, whether the endpoint device has been instructed by another device to reduce message size and/or adjust the transmission rate, an age/time since installation/activation of the device, a number of lifetime transmissions of the device, and the like.

Referring to FIG. 1, EPD 102(N) is shown as transmitting message data 120E at a first time. For purposes of explanation, assume that the one or more criteria utilized by the EPD 102(N) is the battery level for the battery of EPD 102(N). In the current example, when EPD 102(N) determines that the battery level is above a first threshold (e.g., >50%, >60%, >90%, . . . ), EPD 102(N) may transmit message data 120E that does not reduce the size of the message (e.g., each of the data fields of the message is transmitted) and/or without adjusting the transmission rate. When the EPD 102(N) determines that the battery level of the device drops below the first threshold, the EPD 102(N) generates a message that is reduced (e.g., one or more data fields of the message are removed prior to transmission) and/or the transmission rate may be reduced (e.g., instead of transmitting at 20 second intervals, the transmission rate changes to 30 second intervals) by the EPD 102(N). After generating the message, the EPD 102(N) transmits the message data 120F. In some examples, the EPD 102(N) may also reduce the transmission rate such that the EDP 102(N) is not transmitting as many messages.

While thresholds have been used as an example for determining when to reduce message size and/or adjust transmission rate, other techniques or mechanisms can be utilized. For example, a formula, a machine learning mechanism, or some other technique can be used to determine when to adjust the message size and/or change the transmission rate. Generally, the fewer bytes transmitted in a message and the less frequently the messages are transmitted conserves battery of a device.

Example Signal Flow between Network Communications Devices

Figure 2:
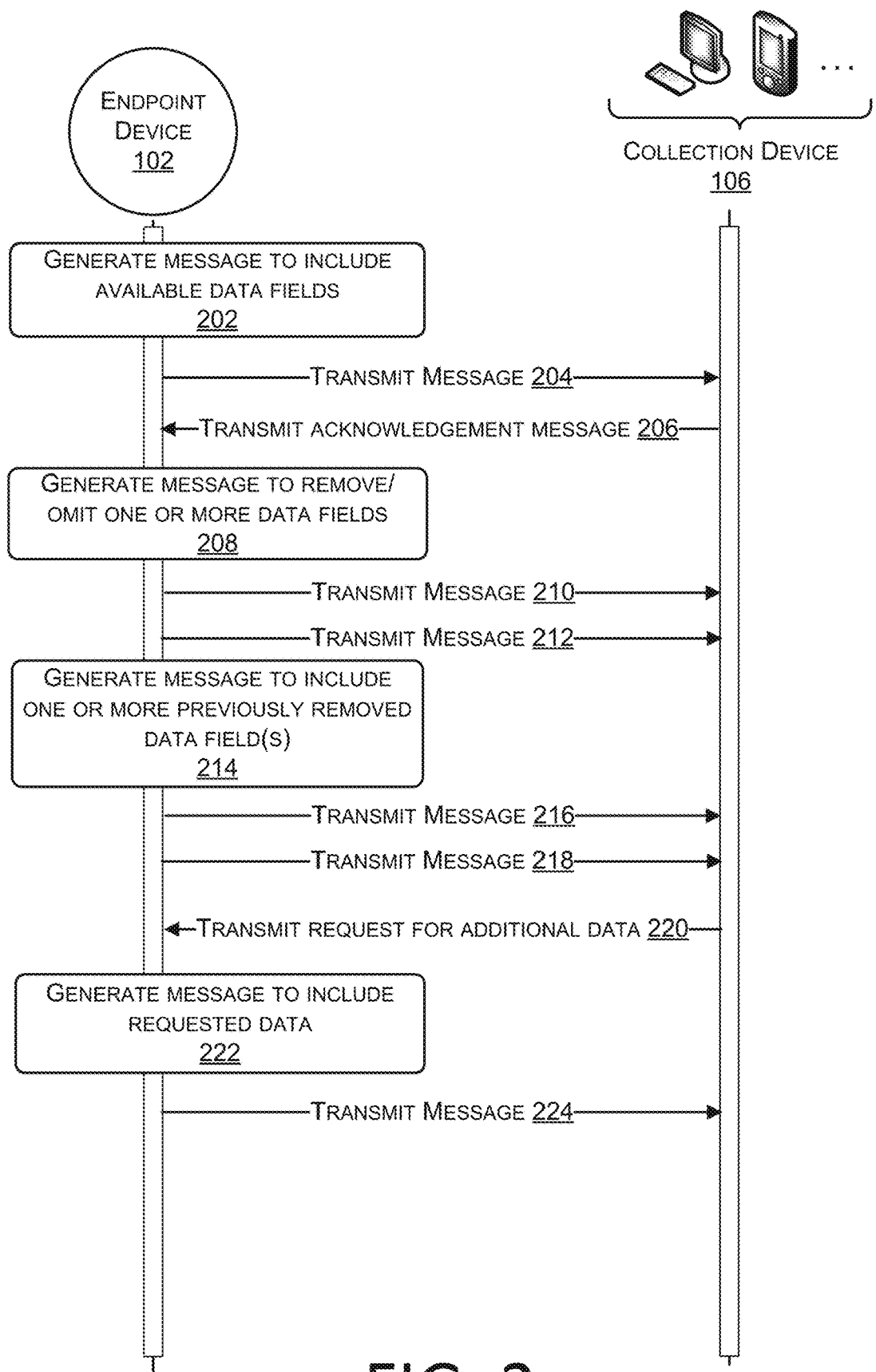
FIG. 2 is a signal flow diagram illustrating aspects of an endpoint device conserving battery by transmitting some messages with fewer data fields.

FIG. 2 is a signal flow diagram illustrating aspects of an endpoint device conserving battery by transmitting some messages with fewer data fields. In FIG. 2, the arrows represent one or more communications between the respective components of the architecture 100. For instance, arrow 204 represents transmission of a message by endpoint device 102 to a collection device 106.

As discussed above, an endpoint device 102, such as a smart UM, may reduce the size of the message transmitted in response to determining that a collection device 106 has received the message. In the current example, the endpoint device 102 initially generates a message (202) that includes the data fields of a "standard message". As used herein, a "standard message" refers to a message that includes each of the data fields as specified by a message protocol (See FIG. 4B for an example message that includes a plurality of data fields). According to some configurations, the message may include an identifier data field that identifies the endpoint device 102, a device type data field that identifies a type of the endpoint device 102, a consumption data field that indicates a consumption of a UM associated with the endpoint device 102, and a tamper data field that indicates whether the endpoint 102 has been tampered with. The exemplary message formats and data fields will be discussed in more detail with regard to FIGS. 4A and 4B.

After generating the message at 202, the endpoint device 102 transmits the message that is received by collection device 106, as represented by arrow 204. Arrow 206 represents the collection device 106 transmitting an acknowledgement message to the endpoint device 102. As briefly discussed above, the endpoint device 102 may periodically "listen" for transmissions. In the current example, the endpoint device 102 actively listens for transmissions for a predetermined period of time after transmitting a message.

After receiving the ACK message, the endpoint device 102 generates a message at 208 that removes one or more of the data fields from the standard message. In some examples, the endpoint device 102 transmits an identifier data field that identifies the endpoint device 102 and removes the other data fields of the message generated at 202. After generating the message, the endpoint device 102 transmits the message including fewer data fields as represented by arrow 210. Arrow 212 represents the endpoint device 102 transmitting a message including the same data fields as previously transmitted. In the current example, the endpoint device 102 transmits messages periodically according to a transmission rate (e.g., 15 seconds, 30 seconds, . . . ).

At 214, the endpoint device 102 determines to generate a message to include additional data fields. In some examples, the endpoint device 102 may receive a message transmitted from the collection device 106 requesting additional data (See arrow 220). In other examples, the endpoint device 102 determines that one or more values associated with one or more data fields that are not currently being transmitted have changed. According to some examples, when a value of a data field not currently included within a message changes, the endpoint device 102 includes at least that data field when generating the message. For instance, when a value of consumption of a UM changes that is associated with the endpoint device 102, the endpoint device 102 generates a message at 214 that includes the identifier data field and at least the consumption data field. In some configurations, the endpoint device 102 includes each of the data fields in the message that were previously removed when a value changes. In yet other examples, the endpoint device 102 may include more or less data fields in the message when a value changes.

Arrow 216 and Arrow 218 indicate the endpoint device 102 transmitting the message. Arrow 220 represents the collection device 106 transmitting a message that requests additional data from the endpoint device 102.

After receiving the message, the endpoint device 102 generates a message to include the requested data. The endpoint device 102 then transmits the message including the additional data as represented by arrow 224.

Figure 3A:
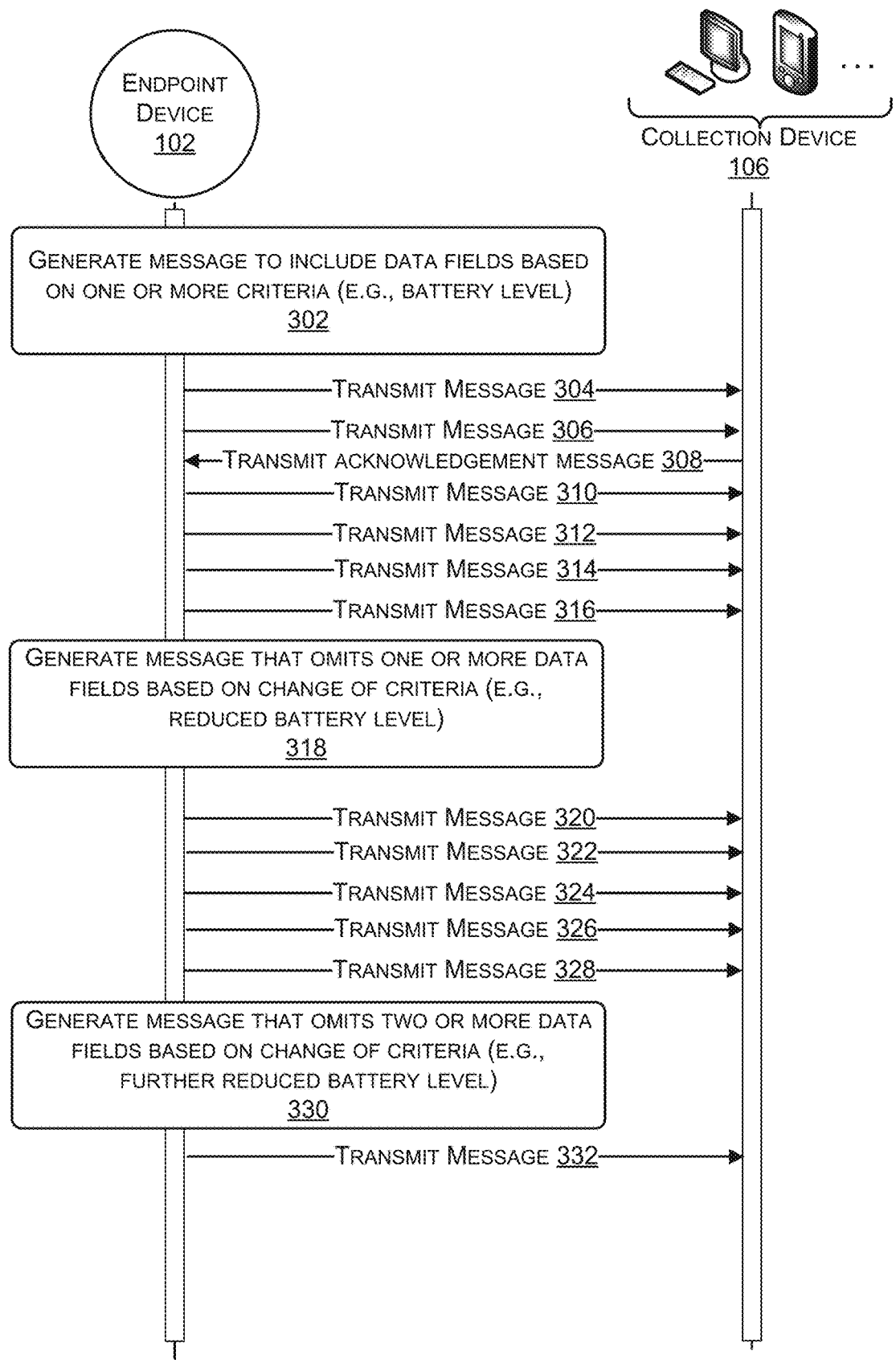
FIG. 3A is a signal flow diagram illustrating aspects of removing or omitting data fields within a message, before transmission by an endpoint device, based on one or more criteria to conserve battery life and/or reduce network traffic.

FIG. 3A is a signal flow diagram illustrating aspects of removing data fields within a message, before transmission by an endpoint device 102, based on one or more criteria to conserve battery. As discussed above, an endpoint device 102 may generate messages that include data fields based on one or more criteria, such as battery level. Other criteria that can be utilized include, but are not limited to a time period, such as the time of year (e.g., winter, summer, . . . ), whether the data has already been transmitted in a previous message, whether the data was indicated as received by another device, whether the endpoint device 102 has been instructed by another device to reduce message size and/or adjust the transmission rate, an age/time since installation/activation of the endpoint device, a number of lifetime transmissions of the endpoint device, and the like.

For purposes of explanation, the one or more criteria utilized in the example of FIG. 3A is the battery level of the endpoint device 102. Initially, the battery level of the endpoint device 102 will likely be above a first threshold. In some configurations, during a time the battery level is above the first threshold, the endpoint device 102 may generate a message that includes each of the data fields of the standard message. Arrows 304, 306, 310, 312, 314, and 316 represent the endpoint device 102 transmitting a generated message at the current transmission rate that includes each of the data fields as long as the battery level remains above the first threshold. The endpoint device 102 may check the battery level at periodic times, before transmitting a message, and/or at other determined times.

In other examples, the endpoint device 102 may change the data fields to include in a generated message based on other criteria. For example, the endpoint device 102 may remove one or more data fields from a message in response to receiving a ACK message transmitted by the collection device 106 as represented by arrow 308.

At 318, the endpoint device 102 generates a message that includes at least one less data field as compared to the message generated at 302 based on determining that the one or more criteria have changed. In the current example, the endpoint device 102 determines that the battery level of the endpoint device 102 has fallen below the first threshold (e.g., the battery level is less than 50%, 10%, or some other value). In response to determining that the one or more criteria have dropped below the threshold, the endpoint device 102 generates a message that includes at least one fewer data fields as compared to the message generated at 302. Arrows 320, 322, 324, 326, and 328 represent the endpoint device 102 transmitting a generated message that includes each of the data fields used to generate the message in 318.

At 330, the endpoint device 102 generates a message that includes at least one less data field as compared to the message generated at 318 based on determining that the one or more criteria have further changed. In the current example, the endpoint device 102 determines that the battery level of the endpoint device 102 has fallen below a second threshold (e.g., the battery level is less than 20%, 10%, 1%, or some other value). In response to determining that the one or more criteria have dropped below the second threshold, the endpoint device 102 generates a message that include at least one fewer data fields as compared to the message generated at 318. For instance, the endpoint device 102 may generate a message that includes the identifier data field but does not include the other data fields. The arrow 332 represents the endpoint device 102 transmitting the message generated at 330.

Figure 3B:
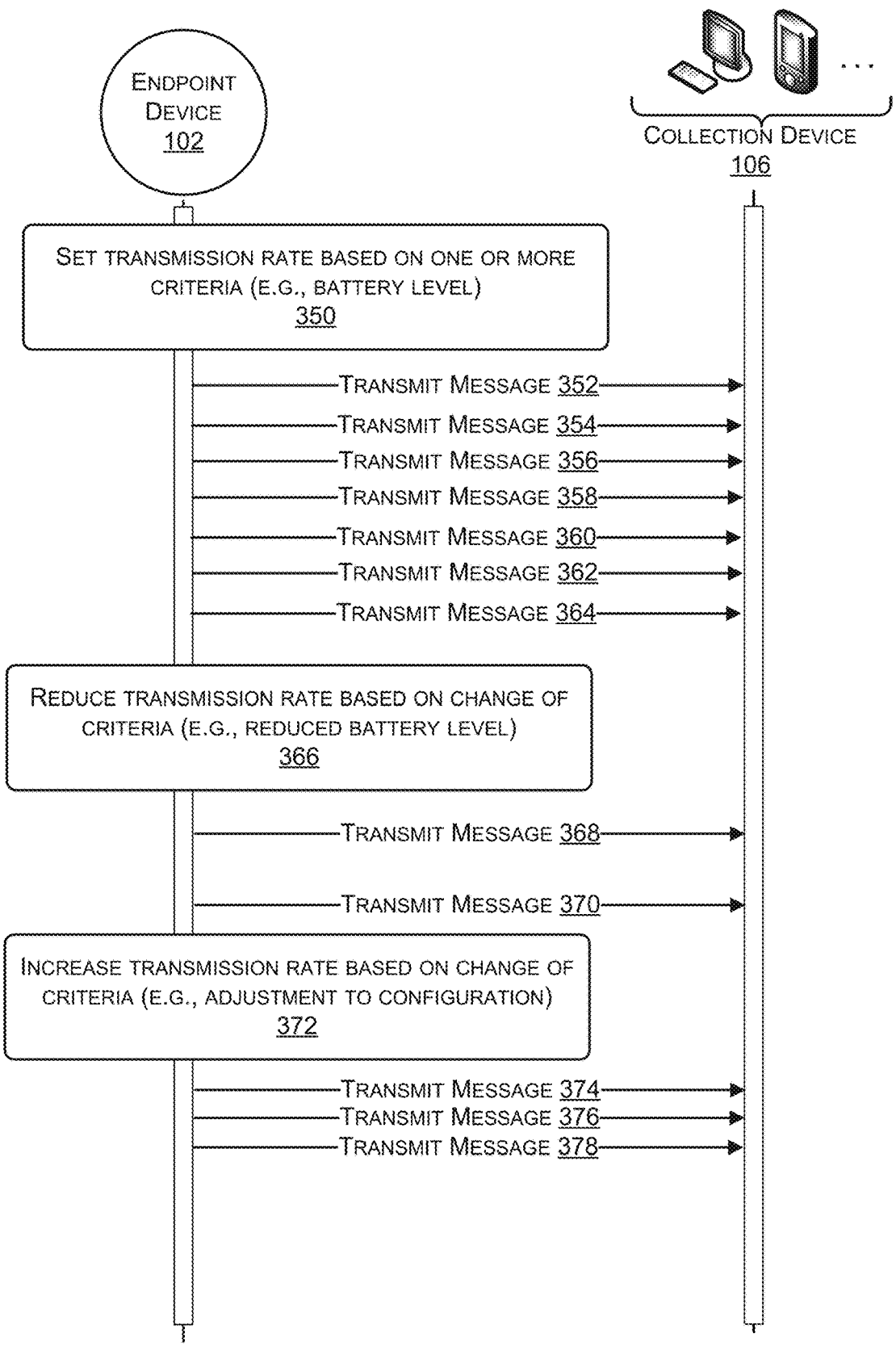
FIG. 3B is a signal flow diagram illustrating aspects of adjusting a transmission rate for an endpoint device based on one or more criteria to conserve battery life and/or reduce network traffic.

FIG. 3B is a signal flow diagram illustrating aspects of adjusting a transmission rate for an endpoint device based on one or more criteria to conserve battery. As discussed above, an endpoint device 102 may adjust a transmission rate for transmission of messages that include data fields based on one or more criteria, such as battery level. Other criteria that can be utilized include, but are not limited to a time period, such as the time of year (e.g., winter, summer, . . . ), whether the data has already been transmitted in a previous message, whether the data was indicated as received by another device, whether the endpoint device 102 has been instructed by another device to reduce message size and/or adjust the transmission rate, an age/time since installation/activation of the endpoint device, a number of lifetime transmissions of the endpoint device, and the like.

For purposes of explanation, the one or more criteria utilized in the example of FIG. 3B is the battery level of the endpoint device 102. In some configurations, during a time the battery level is above the first threshold, the endpoint device 102 sets the transmission rate to a first transmission rate at 350. The transmission rate may be any rate. For example, the transmission rate may be periodic (e.g., every 1 second, 15 seconds, 20 seconds, 30 seconds, . . . ) or non-periodic (in response to some event, request, at specific times, . . . ). Arrows 352, 354, 356, 358, 360, 362, and 364 represent the endpoint device 102 transmitting a generated message at the first transmission rate as long as the battery level remains above the first threshold.

In other examples, the endpoint device 102 may change the transmission rate based on other criteria. For example, the endpoint device 102 may decrease the transmission rate in response to receiving a ACK message as represented by arrow 308 in FIG. 3A, receiving a request by another device, and the like.

At 366, the endpoint device 102 reduces the transmission rate in response to determining that the one or more criteria have further changed. In the current example, the endpoint device 102 determines that the battery level of the endpoint device 102 has fallen below the first threshold (e.g., the battery level is less than 50%, 10%, or some other value). In response to determining that the one or more criteria have dropped below the threshold, the endpoint device 102 reduces the transmission rate to a second transmission rate. As illustrated, the endpoint device 102 changes the transmission rate such that messages are transmitted half as often as the first transmission rate. The transmission rate may be more or less often depending on the application. Arrows 368, and 370 represent the endpoint device 102 transmitting a generated message according to the transmission rate set at 366.

At 372, the endpoint device 102 increases the transmission rate in response to determining that the one or more criteria have changed. In the current example, the endpoint device 102 determines that a configuration of the endpoint device 102 has changed. For example, the endpoint device 102 can receive a new configuration that changes to a metering data interval (e.g., changed from 15 minutes to 60 minutes). In this case, the endpoint device 102 returns to a more frequent transmission rate. Increasing the transmission rate makes it more likely that a mobile reading system will be able to obtain data from the endpoint device 102 without having to drive slower or perform two-way operations that request further data. In response to determining that the one or more criteria have changed, the endpoint device 102 increases the transmission rate to a third transmission rate. The third transmission rate may be the same or different from the first transmission rate. Arrows 374, 376, and 378 represent the endpoint device 102 transmitting a generated message according to the transmission rate set at 372.

Figure 3C:
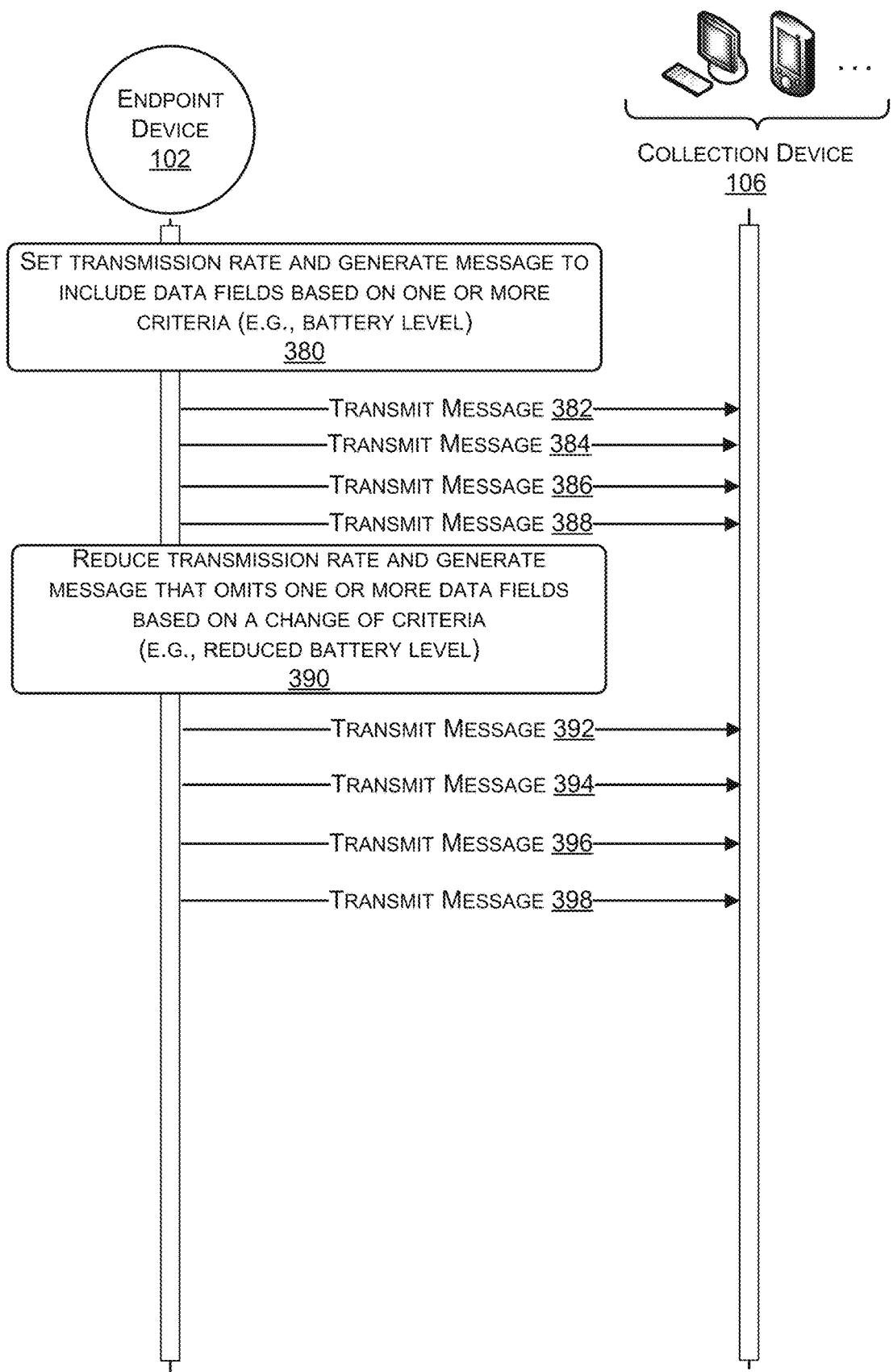
FIG. 3C is a signal flow diagram illustrating aspects of adjusting a transmission rate and removing data fields within a message based on one or more criteria to conserve battery life and/or reduce network traffic.

FIG. 3C is a signal flow diagram illustrating aspects of adjusting a transmission rate and removing data fields within a message based on one or more criteria to conserve battery. As discussed above, an endpoint device 102 may generate messages that include data fields and adjust transmission rates based on one or more criteria, such as battery level. Other criteria that can be utilized include, but are not limited to a time period, such as the time of year (e.g., winter, summer, . . . ), whether the data has already been transmitted in a previous message, whether the data was indicated as received by another device, whether the endpoint device 102 has been instructed by another device to reduce message size and/or adjust the transmission rate, an age/time since installation/activation of the endpoint device, a number of lifetime transmissions of the endpoint device, and the like.

For purposes of explanation, the one or more criteria utilized in the example of FIG. 3C is the battery level of the endpoint device 102. In some configurations, during a time the battery level is above the first threshold, the endpoint device 102 may generate a message that includes each of the data fields of the standard message and transmit the messages at a first transmission rate as represented by 380. Arrows 382, 384, 386, and 388 represent the endpoint device 102 transmitting a generated message that includes each of the data fields at the first transmission rate as long as the battery level remains above the first threshold.

At 390, the endpoint device 102 generates a message that includes at least one less data field as compared to the message generated at 380 and reduces the transmission rate to a second transmission rate based on determining that the one or more criteria have changed. In the current example, the endpoint device 102 determines that the battery level of the endpoint device 102 has fallen below the first threshold (e.g., the battery level is less than 50%, 10%, or some other value). In response to determining that the one or more criteria have dropped below the threshold, the endpoint device 102 generates a message that includes at least one fewer data fields as compared to the message generated at 380 and reduces the transmission rate. Arrows 392, 394, 396, and 398 represent the endpoint device 102 transmitting a generated message according to the second transmission rate as represented by 390.

Example Message and Data Fields

Figure 4A:
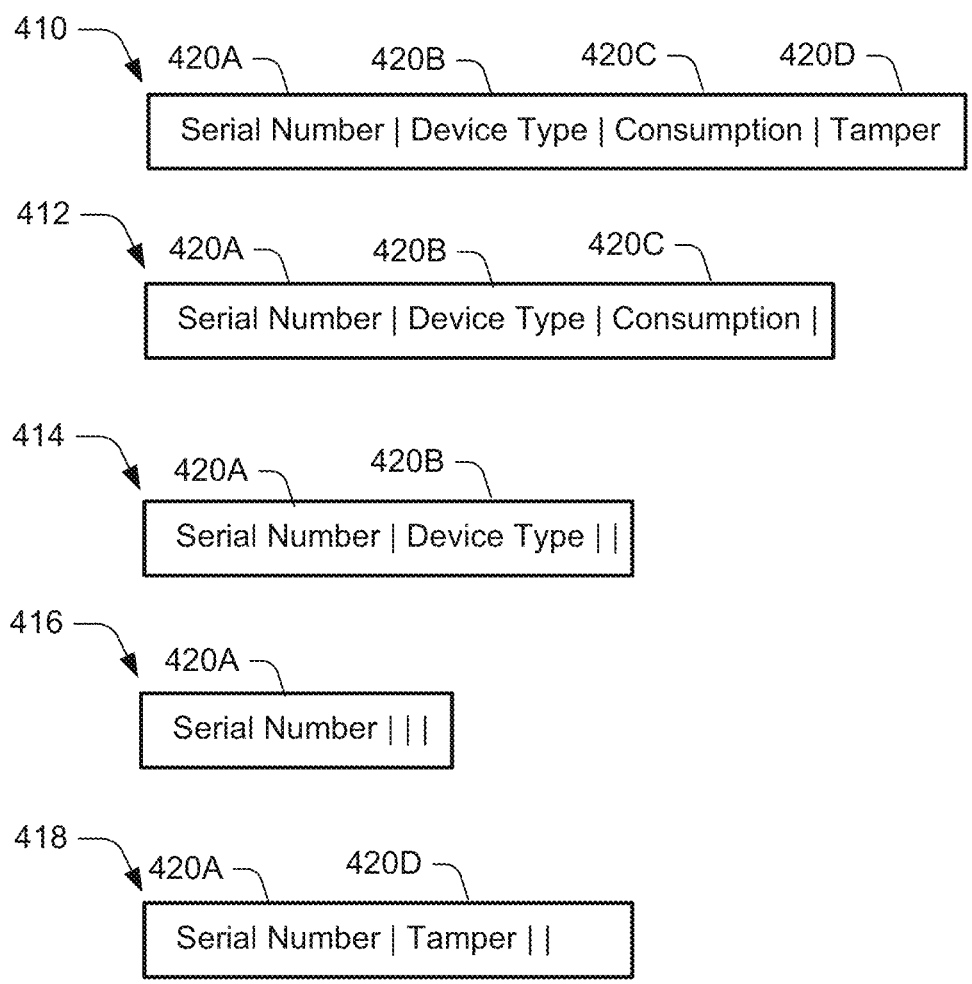
FIG. 4A is a diagram illustrating example messages that include different data fields transmitted by an endpoint device.

FIG. 4A is a diagram illustrating example messages that include different data fields transmitted by an endpoint device. As briefly discussed above, different endpoint devices 102, and/or other electronic devices, may utilize messages that follow different formats. For example, some messages may include one data field, other messages may include two data fields, and other messages can include some other number of data fields.

In the illustrated example, message 410 includes four data fields that include an identifier data field 420A, a device type data field 420B, a consumption data field 420C, and a tamper data field 420D. The identifier data field 420A includes data that identifies the endpoint device 102. In the current example, the serial number of the endpoint device 102 is utilized as the identifier. The device type data field 420 includes data that indicates the type of endpoint device (e.g., gas, water, electric, . . . ). The consumption data field 420C includes data that indicates a consumption as measured by a UM. The tamper data field 420D includes data indicating whether the endpoint device 102 has been tampered with.

As discussed above, the endpoint device 102 is configured to generate messages that include different data fields based on one or more criteria. Message 410 indicates an exemplary standard message that includes four data fields that is sent when the one or more criteria are not met (i.e., battery above a threshold, data not previously transmitted, etc.).

Message 412 in this example does not include the tamper data field 420D but includes the identifier data field 420A, the device type data field 420B, and the consumption data field 420C. In some examples, message 412 may be generated when it is determined to remove a single data field.

Message 414 in this example does not include the tamper data field 420D or the consumption data field 420C but includes the identifier data field 420A, and the device type data field 420B. In some examples, message 414 may be generated when it is determined to remove two data fields.

Message 416 in this example does not include the tamper data field 420D, the consumption data field 420C, or the device type data field 420B but includes the identifier data field 420A. In some examples, message 416 may be generated when it is determined to remove three data fields.

Message 418 in this example does not include the consumption data field 420C or the device type data field 420B but includes the identifier data field 420A, and the tamper data field 420D. In some examples, message 418 may be generated when it is determined to remove two data fields and/or when the endpoint device 102 has been tampered with.

The messages 410, 412, 414, 416, and 418 are provided for explanatory purposes and are not intended to be limiting. Many other message types including different data fields can be utilized.

FIG. 4B is a diagram illustrating an example message that includes different data fields transmitted by an endpoint device. The message 450 includes a plurality of rows ("fields") having entries organized within the Field Name 454 column and the Value 458 column. The Length 456 column indicates the length of the data associated with the data field and is shown for illustration purposes and is not transmitted according to some examples.

In the illustrated example of FIG. 4B, the field name 454 column includes 7 different data fields including data fields for a preamble, a protocol identifier ("ID"), an endpoint type and subtype that is used to identify the endpoint device, an endpoint serial number, a current consumption, tampers/flags, and cyclic redundancy checking ("CRC")-16. In some examples, the field name 454 includes a string of characters that provides a human-readable description of the field. The value column stores a value for the associated field.

The message 450 provides a compact format for encapsulating a standard meter reading. The message 450 depicted in FIG. 4B utilizes a total fixed length of 18 bytes. In particular, the message 450 includes a fixed length 32-bit preamble field, an 8-bit protocol ID field that identifies the data fields included within a message, an 8-bit endpoint type and subtype, a 32 bit endpoint serial number, a 32 bit current consumption, a 16 bit tampers/flags, and a 16 bit CRC-16.

The protocol ID field and endpoint type/subtype field, can be used by a device or component to identify the features of a particular endpoint device 102. The attributes of the message 450 illustrated in FIG. 4B are only illustrative. In this regard, entries within the fields of the message 450 may be added/removed or otherwise modified in alternative examples. Accordingly, the message 450 is only representative one embodiment of how a standard meter reading may be encapsulated in a standard message for transmission by an endpoint 102.

Element 460 illustrates the size of message 450 based on the data fields that are included in the message 450. As discussed above, the standard message (Message A) includes the 7 data fields and is 18 Bytes. Message B that removes field 6 is 16 Bytes. Message C that removes fields 5, and 6 is 12 Bytes. Message D that removes fields 3, 5, and 6 is 11 Bytes, and Message E that removes field 5 is 14 Bytes. In some examples, the collection device 106, or some other device utilizes the protocol ID field to determine what fields are included. As illustrated, each of the messages that include different data fields are identified by a different protocol ID value.

According to some examples, when the endpoint device 102 reduces the size of the message 450 based on the battery level, the endpoint device 102 first generates message A when the battery level is above a first threshold and generates message B when the battery level is below the first threshold but above a second threshold. Endpoint device 102 generates message C when the battery level is below the second threshold but above a third threshold and generates message D when the battery level is below the third threshold but above a fourth threshold.

In other examples, when the endpoint device 102 removes data that has already been sent, the endpoint device 102 may generate message A, then message B, followed by message C, and then message E.

Example Methods of Operation

The example flows of operations 500, 600, and 700 are described in the context of the example of architecture 100 and with reference to the devices illustrated in FIG. 1. However, the flows of operations 500, 600, and 700 are not limited to use with the architecture 100 and devices of FIG. 1 and may be implemented using other architectures and devices.

Figure 5:
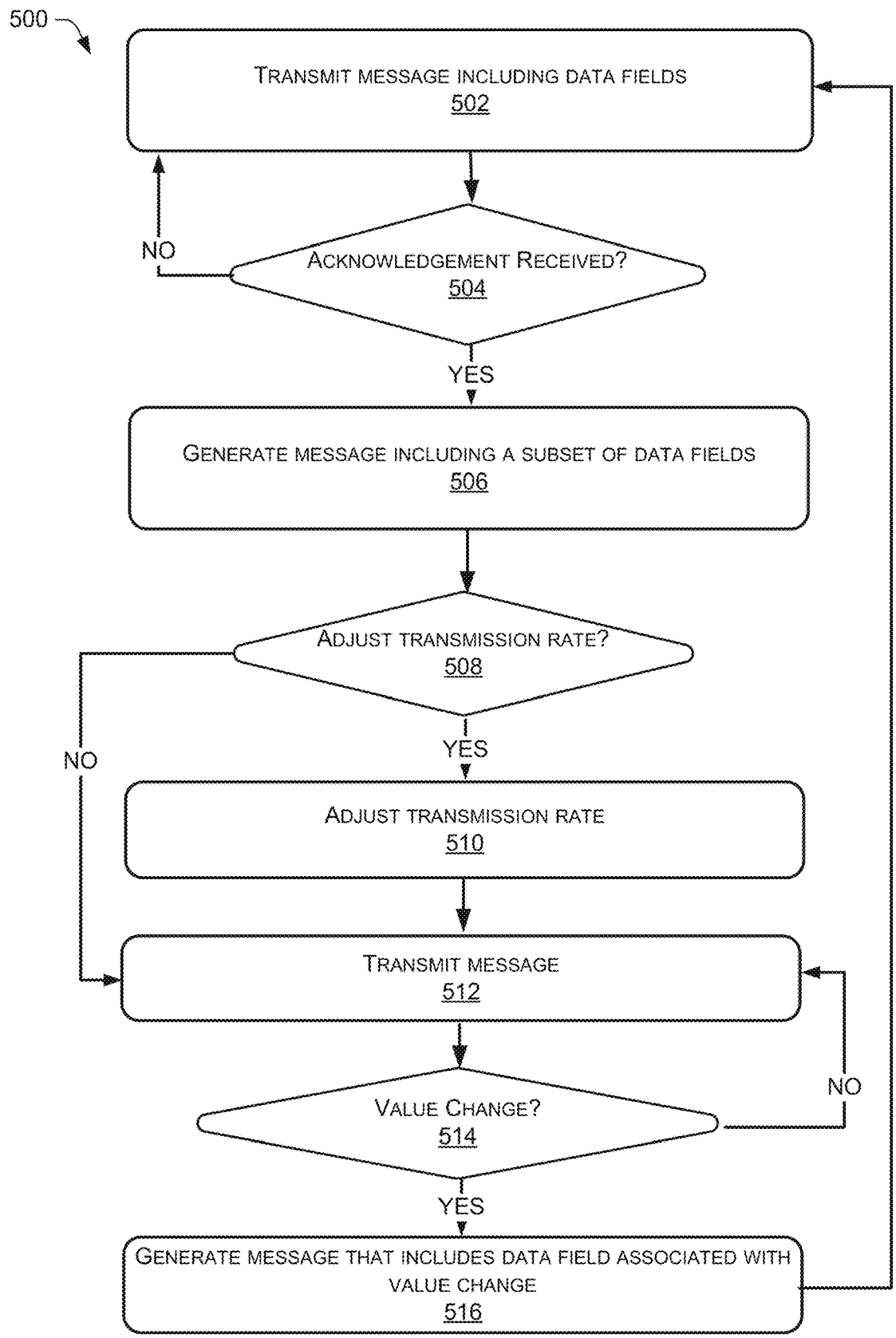
FIG. 5 is a flowchart illustrating a process by which an endpoint device may adjust the data fields transmitted within a message to conserve battery life and/or reduce network traffic.

FIG. 5 is a flowchart 500 illustrating a process by which an endpoint device 102 may adjust the data fields transmitted within a message to reduce battery use. At 502, a message is transmitted by an endpoint device 102 that includes data fields. As discussed above, the message may include each of the data fields specified by a message format and/or a subset of the data fields.

At 504, a determination is made as to whether a message has been received. As discussed above, the endpoint device 102 that transmitted the message is configured to listen for at least a period of time for any messages directed to the endpoint device 102. In some examples, the message may be an acknowledgement message indicating that the message transmitted at 502 has been received. In other examples, the message may be any type of message. For instance, the message may be a message instructing the endpoint device 102 to perform some action (e.g., set a transmission rate to a specified setting, transmit additional data, and the like). In other examples, the message may be any message that can be detected by the endpoint device 102. When a message has not been received, the process 500 returns to 502 where the endpoint device 102 transmits the message containing the same data fields according to the transmission rate associated with the endpoint device 102. When a message has been received, the process 500 moves to 506.

At 506, a message is generated that includes a subset of the data fields as compared to the data fields includes in the message generated at 502. As discussed above, one or more of the data fields included in the message generated at 502 may be removed in order to reduce the size of a transmitted message. In some configurations, the endpoint device 102 generates a message that includes an identifier data field but does not include the other data fields included in the message generated at 502.

At 508, a decision is made as to whether adjust the transmission rate. As discussed above, the transmission rate can be reduced by the endpoint device 102 to conserve battery. In some configurations, the endpoint device 102 uses the one or more criteria to determine when to adjust the transmission rate. In other examples, the endpoint device 102 is instructed by another device or component to adjust the transmission rate. When the transmission rate is not to be adjusted, the process 500 flows to 512. When the transmission rate is to be adjusted, the process 500 flows to 510.

At 510, the transmission rate is adjusted. As discussed above, the endpoint device 102 may adjust the transmission rate. Generally, the adjustment to the transmission rate is a reduction of the transmission rate such that the endpoint device 102 transmits less frequently.

At 512, the message is transmitted. As discussed above, the message generated at 506 includes fewer data fields. Transmitting a smaller sized message reduces battery use, thereby conserving battery for the endpoint device 102.

At 514, a determination is made as to whether a value associated with one of the removed data fields has changed.

For example, a consumption of the UM associated with the endpoint 102 may have changed, the UM may have been tampered with, and the like. When a value has changed, the process 500 flows to 516. When the value has not changed, the process returns to 502 where the message generated at 506 is transmitted according to the current transmission rate.

At 516, a message is generated that includes the data field associated with the value change. As discussed above, the message generated in response to a value change includes at least the data field that includes the change. In other examples, the message generated may include fewer or more data fields. The process 500 may then return to operation 502.

Figure 6:
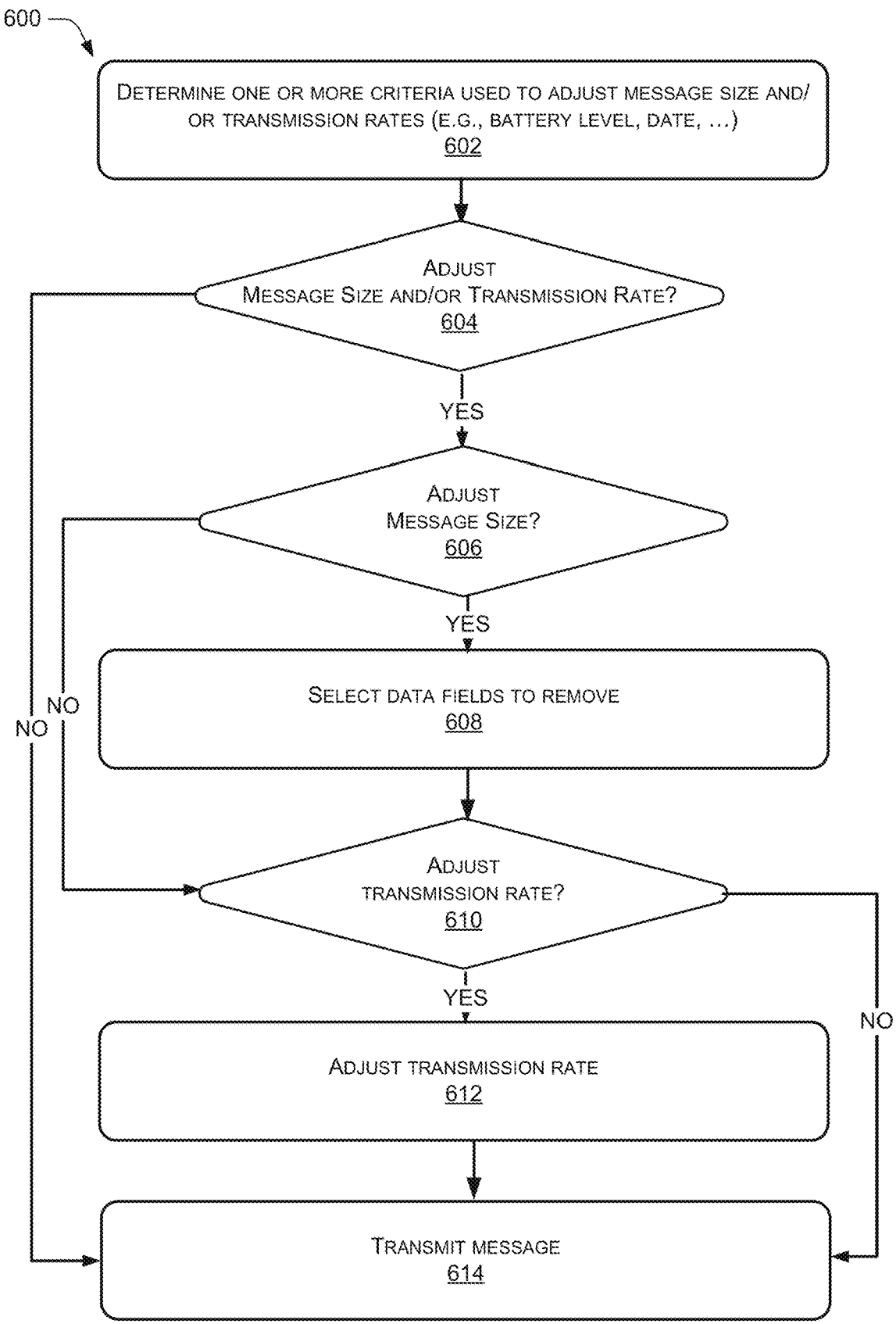
FIG. 6 is a flowchart illustrating a process by which an endpoint device may adjust a transmission rate and remove data fields within a message based on one or more criteria to conserve battery life and/or reduce network traffic.

FIG. 6 is a flowchart illustrating a process 600 by which an endpoint device may adjust a transmission rate and remove data fields within a message based on one or more criteria to reduce battery use. At 602, one or more criteria are determined. As discussed above, one or more criteria can be used to identify when to adjust the message size and/or adjust the transmission rate associated with an endpoint device 102. In some examples, the one or more criteria are configurable for individual endpoint devices 102. For instance, a first endpoint device 102 can be associated with a first set of criteria, and a second endpoint device 102 can be associated with a second set of criteria. The criteria associated with an endpoint device 102 can be based on the specific use and installation of the endpoint device 102. As also discussed herein, the one or more criteria may include, but are not limited to the current battery level of the device, the time of year (e.g., winter, summer, . . . ), whether the data has already been transmitted and received by another device, whether the endpoint device has been instructed by another device to reduce message size and/or adjust the transmission rate, an age/time since installation/activation of the endpoint device, a number of lifetime transmissions of the endpoint device, and the like.

At 604, a decision is made as to whether adjust the message size and/or the transmission rate. As discussed above, to conserve battery, the endpoint device 102, or some other component can reduce a message size, and/or the transmission rate can be adjusted. When the endpoint device 102, or some other component determines not to reduce battery use by changing the message size/transmission rate the process 600 flows to 614 where the message is transmitted. As an example, when a battery of an endpoint device is above a threshold, a message that includes the standard fields of a message may be transmitted.

At 606, a decision is made as to whether to adjust the message size. As discussed above, one or more data fields of a message may be removed to conserve battery of an endpoint device 102 when transmitting a message. When the message size is to be adjusted, the process 600 moves to 608. When the message size is not to be adjusted, the process 600 moves to 610.

At 608, one or more data fields are selected to be removed. As discussed above, there are many different methods and techniques that can be used to select the data fields to include in the message and the fields to remove from the message.

At 610, a decision is made as to whether to adjust the transmission rate. As discussed above, the transmission rate can be reduced to conserve battery of an endpoint device 102 when transmitting messages according to a transmission rate. When the transmission rate is to be adjusted, the process 600 moves to 612. When the transmission rate is not to be adjusted, the process 600 moves to 614.

At 612, the transmission rate is adjusted. As discussed above, the transmission rate can be reduced to different levels depending on the determination of the one or more criteria. For example, when the battery level of an endpoint device 102 is above a first threshold, the transmission rate can be set to a first value by the endpoint device 102. When the battery level of the endpoint device 102 is below a first threshold, the transmission rate can be a second value. When the battery level of the endpoint device 102 is below a second threshold, the transmission rate can be a third value. Similarly, when a UM associated with an endpoint device 102 is not being utilized (e.g., turned off or during a time period where the UM is not being utilized), the transmission rate can be reduced. There are many other times, where the transmission rate can be adjusted.

At 614, the message is transmitted. As discussed above, the endpoint device 102 transmits the message including the selected fields according to the transmission rate of the endpoint device 102.

Figure 7:
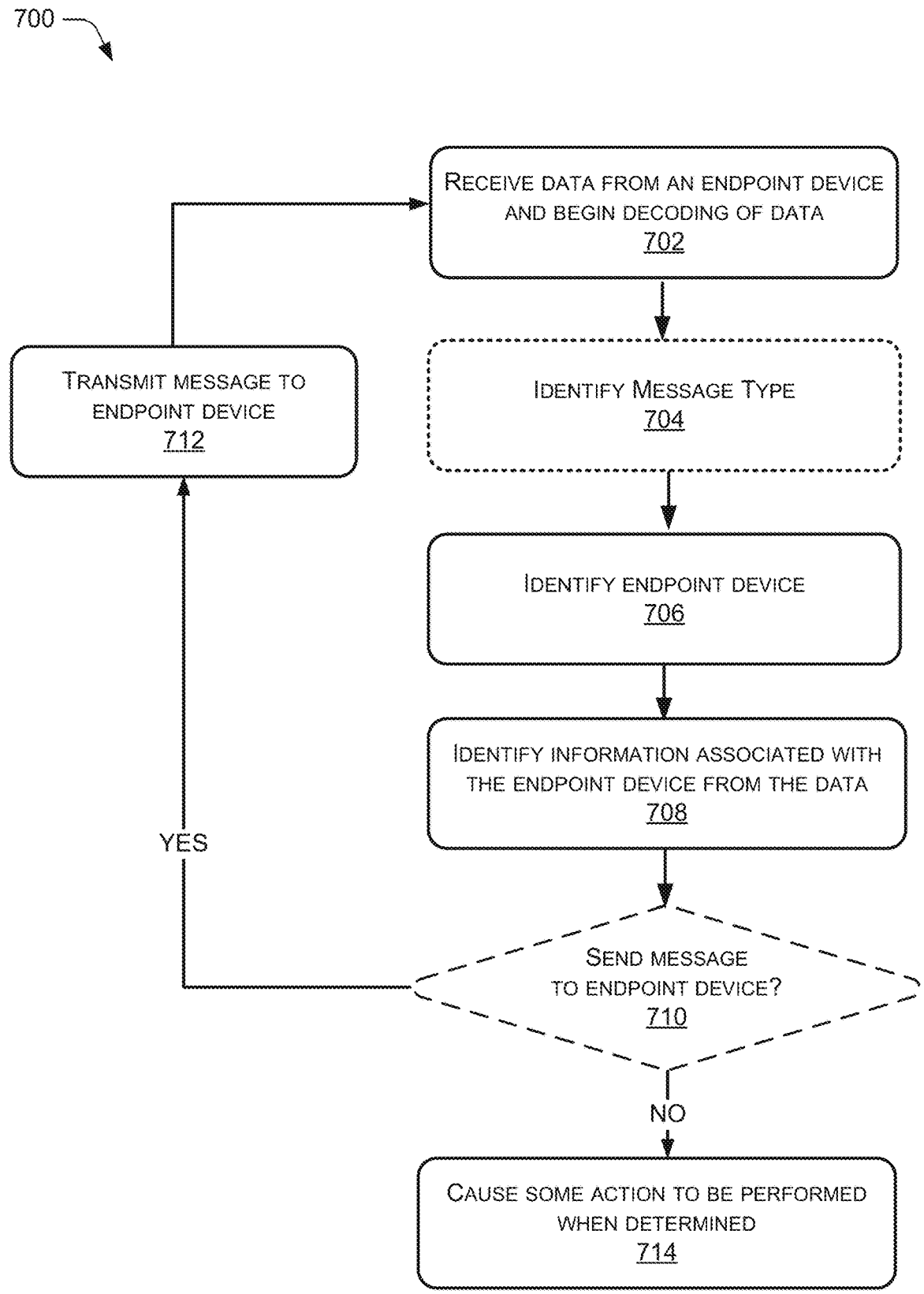
FIG. 7 is a flowchart illustrating a process by which a collection device may receive data transmitted by an endpoint device.

FIG. 7 is a flowchart illustrating a process by which a collection device may receive data transmitted by an endpoint device. At 702, data is received from an endpoint device. As discussed above, the data may be a message transmitted by an endpoint device 102 and received by a collection device 106. In some examples, the data may include each of the data fields in a message. In other examples, the data may include a subset of the data fields included in a message. For instance, at one point in time, the message may include each of the fields illustrated in message 450. At another point in time, the data may include the data fields of message B-E as illustrated in FIG. 4B by element 460. Generally, the collection device receives the data and decodes the data to determine what data fields are included within the data and what data fields may not be included in the data.

At 704, the message type may be identified. As discussed above, in some examples, the collection device 106, or some other device or component, can identify the message type from the protocol ID field of message 450. The message type may be used to identify the data fields included in the message.

At 706, the endpoint device may be identified. As discussed above, the endpoint device 102 may be a variety of different endpoint devices 102 such as a gas meter, a water meter, an electrical meter, or some other type of device that may or may not be associated with a utility service provider. In some examples, the message 450 includes an endpoint type and subtype data field that can be utilized to determine the endpoint device 102. In other examples, the message 450 includes a device identifier field that includes a device identifier that identifies the endpoint device.

At 708, information associated with the endpoint device is identified from the data. As discussed above, the data may include a variety of different information associated with the endpoint 102. In some configurations, the data may include consumption information for a utility meter associated with the endpoint device 102. According to some examples, the consumption information may not be included in each transmission by the endpoint device 102. In this case, the collection device 106 may request additional data from the endpoint device or may wait until the endpoint device 102 transmits the consumption information (e.g., when the consumption of the meter changes, or at some other time).

At 710, a decision may be made as to whether to send a message to the endpoint device. As discussed above, a collection device 106, or some other device or component, can send a message to the endpoint device 102 to acknowledge receipt of the data, request additional data from the endpoint device 102, or request some other action to be performed by the endpoint device. When a message is to be sent to the endpoint device, the process 700 moves to 712. When a message is not to be sent, the process 700 flows to 714.

At 712, the message is transmitted to the endpoint device 102. As discussed above, the message may be transmitted by a collection device 106, and or sent using some other device or component.

At 714, the collection device 102 can also cause other actions to be performed. For example, the collection device may utilize to the data and determined information for generating a bill (e.g., a utility bill); storing at least a portion of the data; transmitting at least a portion of the data (e.g., transmitting the consumption value to another computing device); triggering an alarm and/or causing an alarm condition associated with the battery powered device to be triggered, requesting a list of endpoint devices that have not provided consumption information, or other data, and the like. According to some configurations, the collection device can generate a record that includes values associated with the received data and a value associated with at least one data field that is not included within the message. For example, the collection device 102 can determine a consumption value associated with a utility meter based on a previous transmission of the consumption value. In other configurations, the collection device 102 can generate a record that identifies the missing data field(s) and that one or more values associated with the missing data fields are unknown.

Example Network Communications Devices

Figure 8:
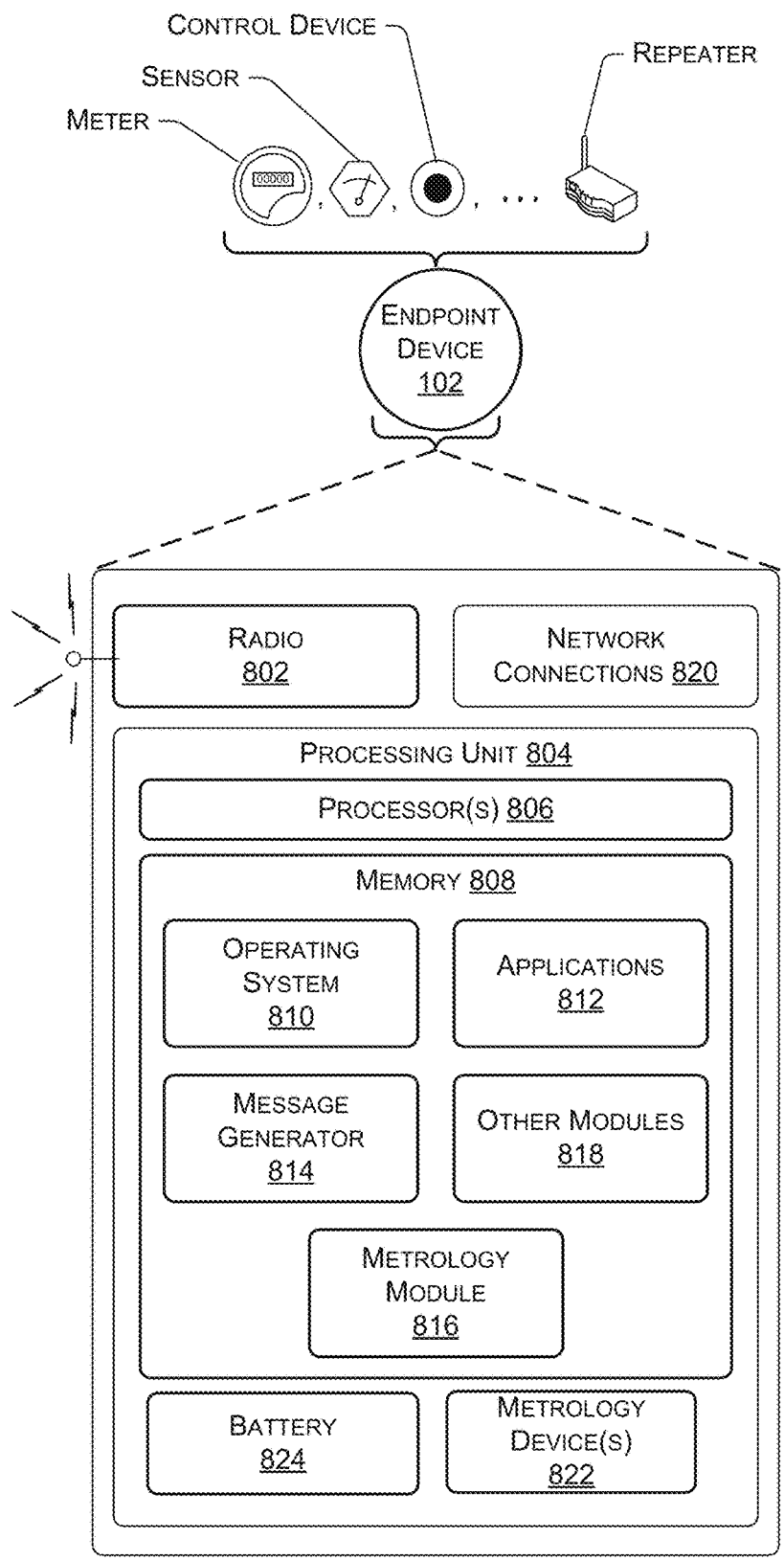
FIG. 8 is a schematic diagram of an example endpoint device.

FIG. 8 is a schematic diagram of an example endpoint device 102. In the illustrated example, the endpoint device 102 is battery powered. However, as discussed above, an endpoint device 102 can take numerous different forms, depending on the industry and context in which they are deployed. Different types of endpoint devices 102 may have different physical and/or logical components. For instance, utility meter endpoint devices such as that shown in FIG. 8 may have metrology components, whereas other types of endpoint devices may not. Similarly, an endpoint device 102 can be associated with one or more peripheral devices (e.g., leak sensors, disconnect valves, water sensors, . . . ).

As shown in FIG. 8, the endpoint device 102 includes a processing unit 804, a radio 802, one or more network connections 820, and one or more batteries 824. The processing unit 804 may include one or more processors 806 and memory 808 and/or other hardware device(s), such as an application specific integrated circuit (ASIC), a gate array or other hardware-based logic device. When present, the processor(s) 806 may comprise microprocessors, central processing units, graphics processing units, or other processors usable to execute program instructions to implement the functionality described herein. Additionally, or alternatively, in some examples, some or all of the functions described may be performed in hardware.

The radio 802 may comprise one or more hardware and/or software implemented radios to provide two-way RF communication with other network communication devices and/or other computing devices via the network 112.

The metrology device(s) 822 comprise the physical hardware and sensors to measure consumption data of a resource (e.g., electricity, water, or gas) at a site of the UM. In the case of an electric meter, for example, the metrology device(s) 822 may include one or more Hall effect sensors, shunts, or the like. In the case of water and gas meters, the metrology device(s) 822 may comprise various flow meters, pressure sensors, or the like. The metrology device(s) 822 may transmit consumption data and other messages via the radio 802 and/or via the network connections 820. The consumption data may be formatted and/or packetized in a manner or protocol for transmission.

The specific characteristics of the battery 824 may vary widely depending on the type of the endpoint device. By way of example and not limitation, the battery 824 of an example water or gas meter of may comprise a 3-volt Lithium Thionyl Chloride battery having an internal impedance rated at 130 Ohms or a 3-volt Lithium Manganese battery having an internal impedance rated at 15 Ohms.

The memory 808 includes an operating system (OS) 810 and one or more applications 812 that are executable by the processor(s) 806. The memory 808 may also include a metrology module 816 configured to receive, interpret, and/or otherwise process the metrology data collected by the metrology device(s) 822. Additionally, or alternatively, one or more of the applications 812 may be configured to receive and/or act on data collected by the metrology device(s) 822.

The memory 808 may also include one or more communication stacks (not shown). In some examples, the communication stack(s) may be configured to implement a 6LowPAN protocol, an 802.15.4e (TDMA CSM/CA) protocol, and/or an 802.15.4g protocol. However, in other examples, other protocols may be used, depending on the networks with which the device is intended to be compatible.

The memory 808 also includes a message generator 814 configured to generate messages as described herein. For example, message generator 814 may determine when to adjust the size of the message and/or adjust the transmission rate as described herein.

The memory 808 is shown to include software functionality configured as one or more "other modules 818" However, the modules are intended to represent example divisions of the software for purposes of discussion and are not intended to represent any type of requirement or required method, manner or necessary organization. Accordingly, while various "modules" are discussed, their functionality and/or similar functionality could be arranged differently (e.g., combined into a fewer number of modules, broken into a larger number of modules, etc.).

Figure 9:
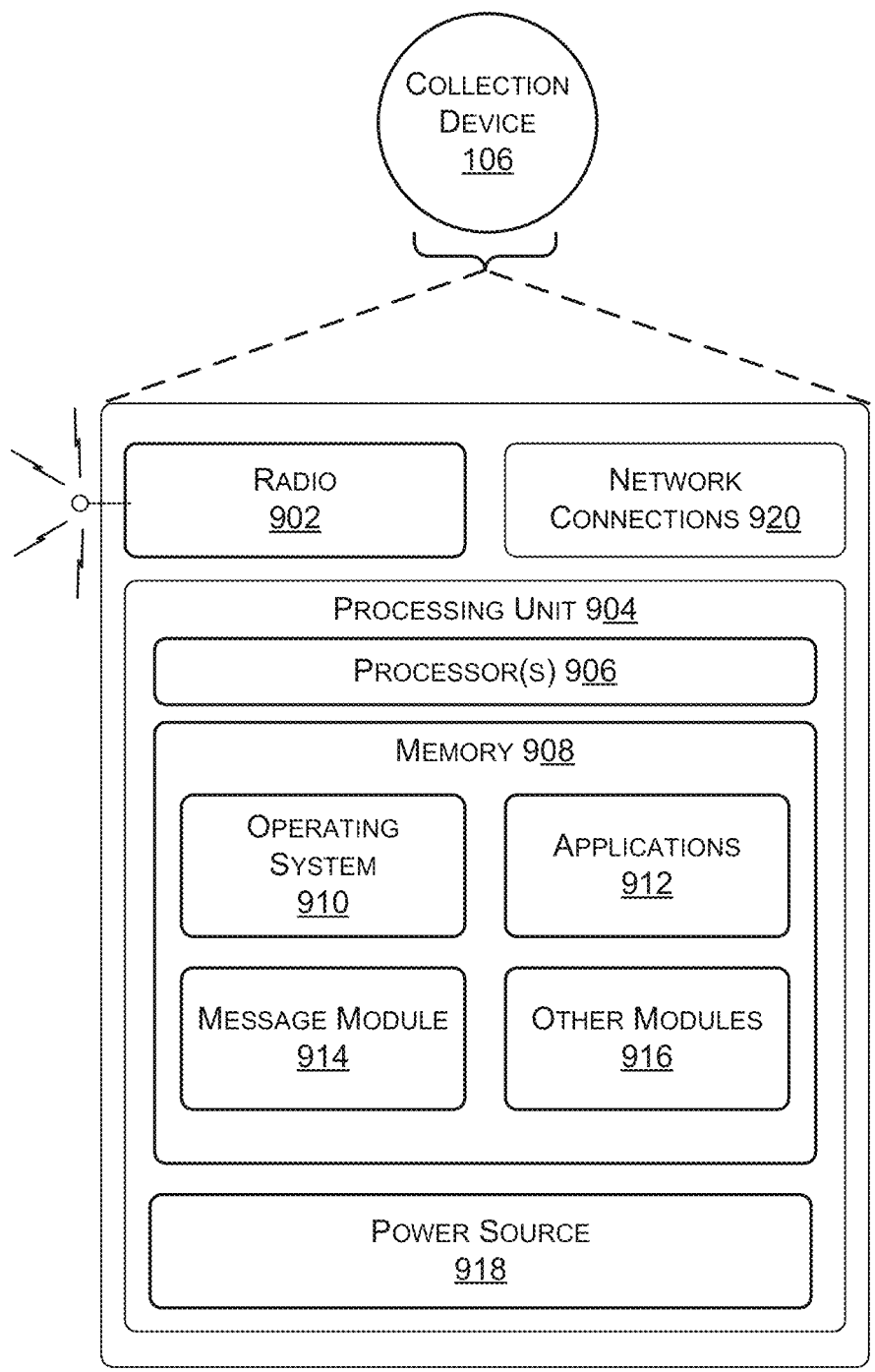
FIG. 9 is a schematic diagram of an example collections device.

FIG. 9 is a schematic diagram of an example collection device 106. In the illustrated example, the collection device 106 is configured to communicate with endpoint devices 102. However, as discussed above, a collection device 106 can take numerous different forms, depending on the industry and context in which they are deployed. Different types of collection devices 106 may have different physical and/or logical components.

As shown in FIG. 9, the collection device 106 includes a processing unit 904, a radio 902, one or more network connections 920, and a power source 918. The processing unit 904 may include one or more processors 906 and memory 908 and/or other hardware device(s), such as an application specific integrated circuit (ASIC), a gate array or other hardware-based logic device. When present, the processor(s) 906 may comprise microprocessors, central processing units, graphics processing units, or other processors usable to execute program instructions to implement the functionality described herein. Additionally, or alternatively, in some examples, some or all of the functions described may be performed in hardware.

The radio 902 may comprises one or more hardware and/or software implemented radios to provide two-way RF communication with other network communication devices and/or other computing devices via the network 112. The specific characteristics of the power source 918 may vary widely depending on the type of the collection device. For example, the power for power source 918 may come from an electric power grid, a self-generated power source (e.g., a solar panel), and/or an energy storage device (i.e., a battery).

The memory 908 includes an operating system (OS) 910 and one or more applications 912 that are executable by the processor(s) 906. The memory 908 may also include a message module 914 configured to receive, interpret, and/or otherwise process data and messages received from one or more of the endpoint devices 102 as described herein. For example, message module 914 may determine that a message does not include a consumption data field, and in response, generate and transmit a message to the endpoint device 102 requesting data that includes the consumption data field. Additionally, or alternatively, one or more of the applications 912 may be configured to receive and/or act on data received from the endpoint devices 102.

The memory 908 may also include one or more communication stacks (not shown). In some examples, the communication stack(s) may be configured to implement a 6LowPAN protocol, an 802.15.4e (TDMA CSM/CA) protocol, and/or an 802.15.4g protocol. However, in other examples, other protocols may be used, depending on the networks with which the device is intended to be compatible.

The memory 908 is shown to include software functionality configured as one or more "other modules 916" However, the modules are intended to represent example divisions of the software for purposes of discussion and are not intended to represent any type of requirement or required method, manner or necessary organization. Accordingly, while various "modules" are discussed, their functionality and/or similar functionality could be arranged differently (e.g., combined into a fewer number of modules, broken into a larger number of modules, etc.).

Figure 10:
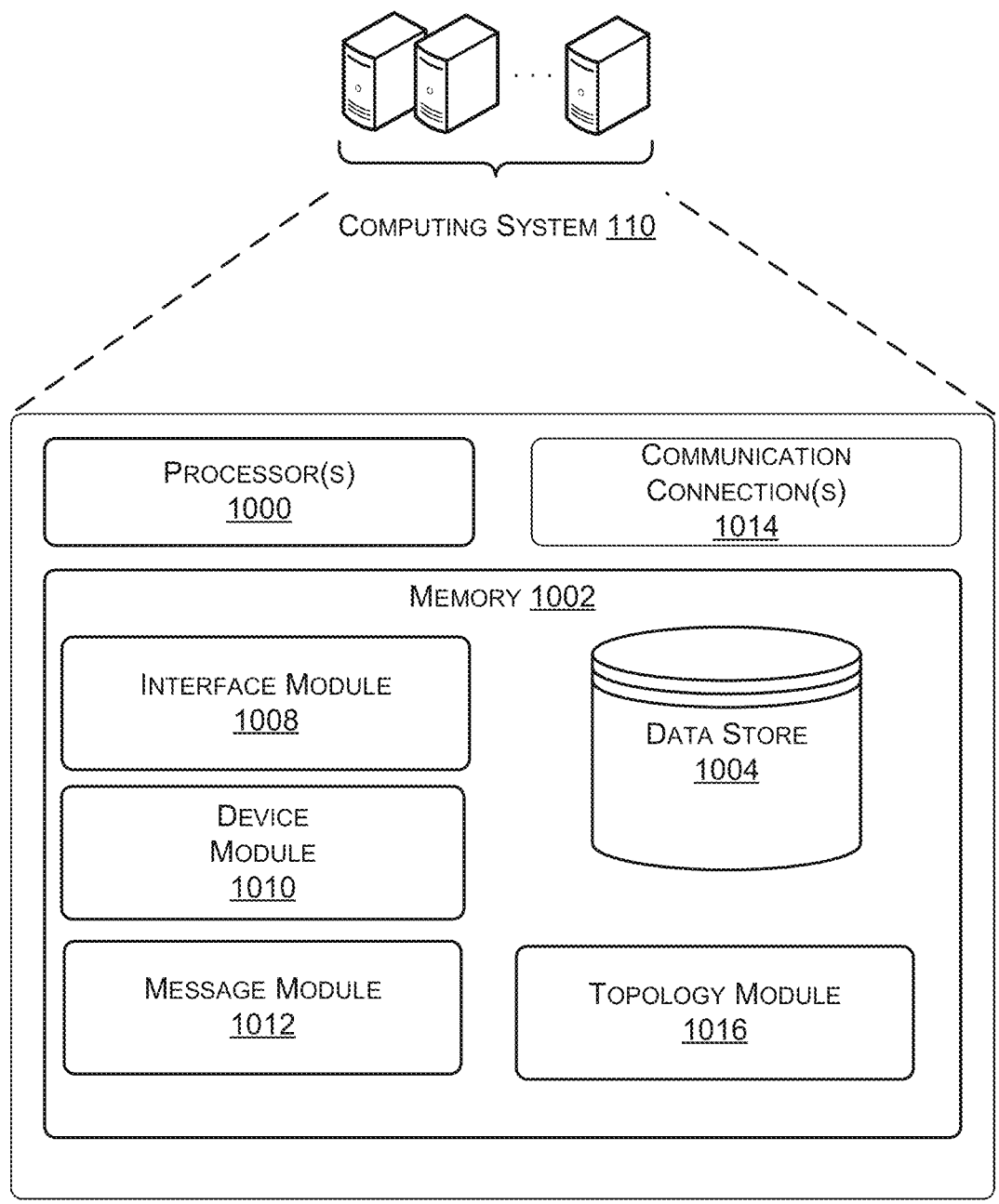
FIG. 10 is a schematic diagram of an example computing system.

FIG. 10 illustrates an example computing system 110 of FIG. 1 in more detail. The computing system 110 may be configured as or disposed at a server, a cluster of servers, a server farm, a data center, a cloud computing resource, or any other computing resource capable of storing and/or providing access to functionality provided by components of the computing system 110. As discussed above, the computing system 110 can be configured to provide functionality associated with a utility service provider. The computing system 110, however, can be configured to provide other functionality.

The computing system 110 may include one or more processors 1000 and memory 1002. The memory 1002 may include a data store 1004 storing data. The data store 1004 may also include metadata associated with one or more applications or other components utilized by a utility service provider and/or some other entity. By way of example and not limitation, the data store 1004 can store information associated with a meter application, a consumer application, and the like. The data store 1004 can also store data associated with the endpoint devices 102, the collection devices 106, as well as other hardware/software.

The memory 1002 may also include a plurality of modules to implement various functions of the computing system 110. For instance, an interface module 1008 may be configured to generate a graphical user interface ("GUI") presenting information to the endpoint devices 102, the collection devices 106, and/or some other computing device. The interface module 1008 may make the interface available to one or more users by, for example, publishing the interface to a website accessible by a browser of a client computing device. When accessed by the computing device, the interface module 1008 may serve as the interface to the computing device. In some examples, the interface module 1008 may provide a GUI that can be used by an authorized user to interact with an endpoint device 102 and/or other devices.

In some configurations, the memory 1002 may store a topology module 1010. The topology module 1016 may maintain information about the device types (e.g., endpoint devices 102), current software versions, and/or locations of devices in the utility supplier's communication network. Alternatively, the memory 1002 may maintain a record of the device types utilized by a utility service provider.

In some embodiments, the memory 1002 may also include a message module 1012 configured to generate messages and receive messages from endpoint devices 102, collection devices 106, as well as other devices, as described herein. For example, the message module can be configured to communicate with endpoint devices 102, such as but not limited to utility meters or other smart sensors, consumer computing devices, and/or utility back office computing devices.

The computing system 110 also includes one or more communication connections 1014 utilized to communicate with other computing devices locally or over a network, such as the network 112. Examples of communication connections include, without limitation, power line communication (PLC) connections, Ethernet or other wired network connections, cellular communication connections, RF communication connections, or the like. As such, the computing system 110 also includes any ancillary hardware, modules, and/or interfaces associated with or needed for the operation of the particular communication connections.

While detailed examples of certain computing devices are described above, it should be understood that even those computing devices not described in detail may include one or more processors and memory storing processor executable instructions to implement the functionalities they are described as performing. Certain computing devices may additionally or alternatively include one or more hardware components (e.g., application specific integrated circuits, field programmable gate arrays, systems on a chip, and the like) to implement some or all of the functionalities they are described as performing The various memories described herein are examples of computer-readable media. Computer-readable media may take the form of volatile memory, such as random-access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals. While a number of representative and/or example implementations are discussed herein, these examples are not an exhaustive or complete catalog of the techniques discussed herein, but are evocative of their structure and operation. Further, while the dependent claims include singular dependencies, any or all of the dependent claim features may be combined with any one or more other dependent claim features of the respective claim set.

Conclusion

Although the disclosure describes embodiments having specific structural features and/or methodological acts, it is to be understood that the claims are not necessarily limited to the specific features or acts described. Rather, the specific features and acts are merely illustrative some embodiments that fall within the scope of the claims of the disclosure.

What is claimed is:

1. A battery powered device comprising:
   a battery;
   one or more processors electrically coupled to the battery;
   memory storing instructions executable by the one or more processors to perform operations comprising:
   determining a first battery level of the battery at a first time;
   selecting one or more data fields, from a plurality of data fields, to include within a first message based, at least in part, on the first battery level;
   generating the first message that includes the one or more data fields, wherein the one or more data fields includes a protocol identifier that provides an indication of the one or more data fields included within the first message and a device identifier that identifies the battery powered device;
   transmitting the first message; and
   adjusting a transmission rate to an updated transmission rate based, at least in part, on the first battery level and transmitting a second message according to the updated transmission rate.

2. The battery powered device of claim 1, further comprising:
   determining a second battery level of the battery at a second time;
   selecting a subset of the one or more data fields to include within the second message based, at least in part, on the second battery level;
   generating the second message that includes the subset of the one or more data fields, wherein the subset of the one or more data fields includes a second protocol identifier that provides an indication of the subset of the one or more data fields included within the second message and the device identifier that identifies the battery powered device; and
   transmitting the second message.

3. The battery powered device of claim 1, wherein selecting the one or more data fields is further based, at least in part, on one or more of a request received from an external device, or a length of time the battery powered device has been in service.

4. The battery powered device of claim 1, wherein adjusting the transmission rate to the updated transmission rate includes reducing the transmission rate at least partly in response to one or more of the first battery level, an age of the battery powered device, a time since activation of the battery powered device, or receipt of an acknowledgement message.

5. The battery powered device of claim 2, wherein the one or more data fields includes a preamble data field, a protocol identifier data field, an endpoint type and subtype data field, an endpoint serial number data field, a current consumption data field, a tamper/flags data field, and a CRC-16 data field, and wherein the subset of the one or more data fields includes the preamble data field, the protocol identifier data field, the endpoint serial number data field, the CRC-16 data field, and a subset of the endpoint type and subtype data field, the current consumption data field, and the tamper/flags data field.

6. The battery powered device of claim 1, wherein selecting the one or more data fields includes selecting a consumption data field in response to determining that the first battery level is within a first range of battery levels.

7. The battery powered device of claim 1, wherein selecting the one or more data fields includes selecting a tamper data field in response to determining that the battery powered device has been tampered with.

8. A method, comprising:
   receiving at a first time, at a first device, first data associated with a battery powered device, wherein the first data includes a device identifier that identifies the battery powered device and a protocol identifier that identifies first data fields included within the first data;
   decoding the first data to identify at least one of the first data fields based, at least in part, on the protocol identifier;
   receiving at a second time, at a second device, second data associated with the battery powered device, wherein the second data includes the device identifier and a second protocol identifier that identifies second data fields that are included in the second data, wherein the second data fields is a subset of the first data fields;
   decoding the second data to identify at least one of the second data fields based, at least in part, on the second protocol identifier; and
   causing a performance of one or more of:
   using at least a portion of the first data or the second data for generating a bill;
   causing at least a portion of one or more of the first data or the second data to be stored;
   transmitting a consumption value obtained from one or more of the first data or the second data;
   triggering an alarm condition associated with the battery powered device;
   transmitting at least a portion of the first data;
   transmitting at least a portion of the second data; or
   transmitting third data to the battery powered device.

9. The method of claim 8, wherein the first device and the second device are the same device, and wherein the first data is a first bubble-up message transmitted by the battery powered device, and the second data is a second bubble-up message transmitted by the battery powered device.

10. The method of claim 8, wherein the second data fields of the second data exclude a consumption data field that indicates a consumption of the battery powered device.

11. The method of claim 8, wherein the first data fields include a tamper data field that indicates a tampering of the battery powered device, and the second data fields of the second data excludes the tamper data field.

12. The method of claim 8, further comprising transmitting third data, the third data indicating that the first device has received the first data.

13. The method of claim 8, further comprising transmitting third data, the third data including a request that the battery powered device transmit additional data.

14. The method of claim 8, further comprising receiving third data associated with the battery powered device, wherein the third data incudes a consumption data field and wherein the third data is generated based, at least in part, on a change in a value associated with the consumption data field.

15. One or more computer-readable media storing instructions executable by one or more processors of a device that when executed cause the one or more processors to perform actions, including:

determining, at a first time, one or more criteria associated with the device, wherein the one or more criteria include one or more of a battery level associated with a battery of the device or a length of time the device has been in service;

selecting one or more data fields, from a plurality of data fields, to include within a first message based, at least in part, on the one or more criteria;

generating the first message that includes the one or more data fields, wherein the one or more data fields includes a protocol identifier field that provides an indication of the one or more data fields included within the first message and a device identifier field that identifies the device;

causing the first message to be transmitted to one or more collection devices; and adjusting a transmission rate to an updated transmission rate based, at least in part, on the battery level and transmitting a second message according to the updated transmission rate.

16. The one or more computer-readable media of claim 15, further comprising:

determining, at a second time, one or more criteria associated with the device, wherein the one or more criteria include one or more of a second battery level of the battery or a second length of time the device has been in service;

selecting a subset of the one or more data fields to include within the second message based, at least in part, on the second battery level;

generating the second message that includes the subset of the one or more data fields, wherein the subset of the one or more data fields includes a second protocol identifier that provides an indication of the subset of the one or more data fields included within the second message and the device identifier field that identifies the device; and causing the second message to be transmitted to the one or more collection devices.

17. The one or more computer-readable media of claim 16, wherein the one or more data fields includes a preamble data field, a protocol identifier data field, an endpoint type and subtype data field, an endpoint serial number data field, a current consumption data field, a tamper/flags data field, and a CRC-16 data field, and wherein the subset of the one or more data fields includes the preamble data field, the protocol identifier data field, the endpoint serial number data field, the CRC-16 data field, and a subset of the endpoint type and subtype data field, the current consumption data field, and the tamper/flags data field.

18. The one or more computer-readable media of claim 15, wherein selecting the one or more data fields includes selecting one or more of a consumption data field or a tamper data field in response to determining that the battery level is within a first range of battery levels.

19. The one or more computer-readable media of claim 15, wherein selecting the one or more data fields is further based, at least in part, on one or more of a request received from an external device, or a length of time the device has been in service.

20. The one or more computer-readable media of claim 15, wherein adjusting the transmission rate to the updated transmission rate includes reducing the transmission rate at least partly in response to one or more of the battery level, an age of the device, a time since activation of the device, or receipt of an acknowledgement message.

\* \* \* \* \*